(12) United States Patent
Liu et al.

(10) Patent No.: US 11,081,539 B2
(45) Date of Patent: Aug. 3, 2021

(54) DISPLAY SUBSTRATE AND DISPLAY DEVICE

(71) Applicant: BOE Technology Group Co., Ltd., Beijing (CN)

(72) Inventors: Libin Liu, Beijing (CN); Qian Yang, Beijing (CN); Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 16/630,496

(22) PCT Filed: Dec. 27, 2018

(86) PCT No.: PCT/CN2018/124386
§ 371 (c)(1),
(2) Date: Jan. 13, 2020

(87) PCT Pub. No.: WO2019/153938
PCT Pub. Date: Aug. 15, 2019

(65) Prior Publication Data
US 2020/0168692 A1    May 28, 2020

(30) Foreign Application Priority Data

Feb. 9, 2018 (CN) .......................... 201810137014.6

(51) Int. Cl.
*H01L 27/32* (2006.01)
*G09G 3/20* (2006.01)
(Continued)

(52) U.S. Cl.
CPC ....... *H01L 27/3276* (2013.01); *G09G 3/2003* (2013.01); *G09G 3/2986* (2013.01);
(Continued)

(58) Field of Classification Search
CPC ............. H01L 27/3276; H01L 27/3216; H01L 27/3218; H01L 27/3244; H01L 27/3211;
(Continued)

(56) References Cited

U.S. PATENT DOCUMENTS 9,984,624 B2 * 5/2018 Takahashi ............. G06F 3/0412
2016/0260401 A1    9/2016 Sakaigawa
(Continued)

FOREIGN PATENT DOCUMENTS

CN          105938266 A      9/2016
CN          107481671 A     12/2017
(Continued)

OTHER PUBLICATIONS

International Search Report dated Mar. 29, 2019 from PCT/CN2018/124386.
(Continued)

*Primary Examiner* — Galina G Yushina
(74) *Attorney, Agent, or Firm* — Fay Sharpe LLP

(57) ABSTRACT

A display substrate and a display device are disclosed. The display substrate (10) includes a plurality of repeating units (100), a plurality of primary signal lines (21) and an auxiliary signal line (22). Each of the repeating units (100) includes a first sub-pixel (R1), a second sub-pixel (B1) and two third sub-pixels (G1, G2). The two third sub-pixels (G1, G2) are located between two adjacent primary signal lines (21). In each of the repeating units (100), the first sub-pixel (R1) and the second sub-pixel (B1) are arranged in a first direction (X), and the two third sub-pixels (G1, G2) are arranged in a second direction (Y). The first direction (X) and the second direction (Y) are different directions. At least one auxiliary signal line (22) is disposed between the two adjacent primary signal lines (21). Two ends of the auxiliary signal line (22) are respectively connected to the two adja- (Continued)

cent primary signal lines (21). The two third sub-pixels (G1, G2) are respectively located on two sides of the auxiliary signal line (22).

20 Claims, 20 Drawing Sheets

(51) Int. Cl.
  *G09G 3/298* (2013.01)
  *G09G 3/3233* (2016.01)
  *G09G 3/3208* (2016.01)
(52) U.S. Cl.
  CPC .......... *G09G 3/3208* (2013.01); *G09G 3/3233* (2013.01); *H01L 27/3211* (2013.01); *H01L 27/3216* (2013.01); *H01L 27/3244* (2013.01); *H01L 27/3288* (2013.01); *H01L 2227/32* (2013.01)
(58) Field of Classification Search
  CPC ............ H01L 27/3288; H01L 2227/32; G09G 3/3233; G09G 3/2003; G09G 3/2986; G09G 3/3208
  See application file for complete search history.

(56) References Cited

U.S. PATENT DOCUMENTS

| | | | | |
|---|---|---|---|---|
| 2016/0370919 | A1* | 12/2016 | Xu | ........................ G06F 3/04166 |
| 2018/0012547 | A1* | 1/2018 | Li | ........................ H01L 27/323 |
| 2018/0097043 | A1* | 4/2018 | Song | ................... H01L 27/3246 |
| 2019/0035859 | A1* | 1/2019 | Kang | .................. H01L 27/3234 |
| 2019/0103058 | A1 | 4/2019 | Ma et al. | |

FOREIGN PATENT DOCUMENTS

| | | |
|---|---|---|
| CN | 207781608 U | 8/2018 |
| JP | 2008197491 A | 8/2008 |

OTHER PUBLICATIONS

Examination report of Indian application No. 202017026082 dated May 25, 2021.
Jongwoon Park et al., Luminance Uniformity of Large-Area OLEDs With an Auxiliary Metal Electrode; Aug. 8, 2009, abstract and description.

* cited by examiner

DISPLAY SUBSTRATE AND DISPLAY DEVICE

CROSS-REFERENCE TO RELATED APPLICATION

This application is a 371 of PCT/CN2018/124386 filed on Dec. 27, 2018, which claims priority to Chinese Patent Application No. 201810137014.6 filed on Feb. 9, 2018 and entitled "DISPLAY SUBSTRATE AND DISPLAY DEVICE", the entire contents of which are incorporated herein by reference.

TECHNICAL FIELD

The present disclosure relates to a display substrate and a display device.

BACKGROUND

Organic light-emitting diode (OLED) display panels have characteristics of being self-luminous, high contrast, low power consumption, wide viewing angle, fast response, being applicable to flexible panels, wide temperature range, and simple manufacturing, which thus gain more development prospects. The OLED display panels may be used in electronic products such as mobile phones, computers, full-color TVs, digital video cameras, and personal digital assistants. The components on the OLED display panel need to be electrically connected to a drive chip by a wire.

SUMMARY

Embodiments of the present disclosure provide a display substrate. The display substrate includes: a plurality of repeating units, a plurality of primary signal lines, and an auxiliary signal line. Each of the repeating units includes a first sub-pixel, a second sub-pixel, and two third sub-pixels. In each of the repeating units, the first sub-pixel and the second sub-pixel are arranged in a first direction, and the two third sub-pixels are arranged in a second direction. The first direction and the second direction are different directions. The two third sub-pixels are located between two adjacent primary signal lines. At least one auxiliary signal line is disposed between the two adjacent primary signal lines. Two ends of the auxiliary signal line are respectively electrically connected to the two adjacent primary signal lines, and the two third sub-pixels are respectively located on two sides of the auxiliary signal line.

Optionally, in the display substrate according to an embodiment of the present disclosure, the plurality of primary signal lines extend in the same direction, and an extending direction of the auxiliary signal line is different from the extending direction of the plurality of primary signal lines.

Optionally, in the display substrate according to an embodiment of the present disclosure, an extending direction of each of the primary signal lines is the second direction, each of the primary signal lines has a shape of wave, and on the same side of the primary signal line, if a peak portion of the wave is adjacent to the first sub-pixel, a trough portion of the wave is adjacent to the second sub-pixel.

Optionally, in the display substrate according to an embodiment of the present disclosure, the plurality of repeating units form a plurality of repeating unit rows, each of the repeating unit rows including a plurality of repeating units that are arranged in a third direction, the plurality of repeating unit rows being arranged in a fourth direction, the third direction being different from the fourth direction; and the auxiliary signal line includes a first line segment, a second line segment, and a third line segment, the third line segment extending in the first direction, the first line segment being located between the first sub-pixel and the second sub-pixel directly adjacent to the first sub-pixel in an adjacent repeating unit row, the third line segment being located between two third sub-pixels in the same repeating unit, and the second line segment being configured to connect the first line segment and the third line segment, wherein a projection of the third line segment of the auxiliary signal line located in an odd-numbered repeating unit row in the second direction does not overlap a projection of the third line segment of the auxiliary signal line located in an even-numbered repeating unit row in the second direction; or the plurality of repeating units form a plurality of repeating unit columns, each of the repeating unit columns including a plurality of repeating units that are arranged in a third direction, and the plurality of repeating unit columns being arranged in a fourth direction, the third direction being different from the fourth direction; and the auxiliary signal line includes a first line segment, a second line segment, and a third line segment, the third line segment extending in the first direction, the first line segment being located between the first sub-pixel and the second sub-pixel directly adjacent to the first sub-pixel in an adjacent repeating unit column, the third line segment being located between two third sub-pixels in the same repeating unit, and the second line segment being configured to connect the first line segment and the third line segment, wherein a projection of the third line segment of the auxiliary signal line located in an odd-numbered repeating unit column in the second direction does not overlap a projection of the third line segment of the auxiliary signal line located in an even-numbered repeating unit column in the second direction.

Optionally, the third direction is parallel to the first direction, and the fourth direction is parallel to the second direction.

Optionally, in the display substrate according to an embodiment of the present disclosure, in each of the repeating units, in the first direction, the first sub-pixel and the second sub-pixel are respectively located on two sides of the two third sub-pixels.

Optionally, in the display substrate according to an embodiment of the present disclosure, the first direction and the second direction are respectively two directions perpendicular to each other in the same plane.

Optionally, in the display substrate according to an embodiment of the present disclosure, the two adjacent primary signal lines include a first primary signal line and a second primary signal line, and the two adjacent primary signal lines satisfy the following condition:

the first primary signal line is located on a side of the first sub-pixel distal from the two third sub-pixels, and the second primary signal line is located on a side of the second sub-pixel proximal to the two third sub-pixels; or the first primary signal line is located on a side of the first sub-pixel proximal to the two third sub-pixels, and the second primary signal line is located on a side of the second sub-pixel proximal to the two third sub-pixels.

Optionally, in the display substrate according to an embodiment of the present disclosure, with respect to each of the repeating units, two vertices of a first diagonal of a parallelogram are respectively located in the first sub-pixel and the second sub-pixel, and two vertices of a second diagonal of the parallelogram are respectively located in the two third sub-pixels.

Optionally, in the display substrate according to an embodiment of the present disclosure, in each of the repeating units, lines connecting a center of the first sub-pixel, a center of the second sub-pixel, and centers of the two third sub-pixels form the parallelogram, the center of the first sub-pixel and the center of the second sub-pixel respectively coincide with the two vertices of the first diagonal of the parallelogram, and the centers of the two third sub-pixels respectively coincide with the two vertices of the second diagonal of the parallelogram.

Optionally, in the display substrate according to an embodiment of the present disclosure, the first diagonal is longer than the second diagonal.

Optionally, in the display substrate according to an embodiment of the present disclosure, a length of the second diagonal is greater than half a length of the first sub-pixel or the second sub-pixel in the direction of the second diagonal.

Optionally, in the display substrate according to an embodiment of the present disclosure, form a plurality of repeating unit rows, each of the repeating unit rows including a plurality of repeating units that are arranged in a direction of the first diagonal to form a repeating unit row, the plurality of repeating unit rows being arranged in a direction of the second diagonal; and a minimum length of a line connecting centers of mutually-proximate third sub-pixels of two repeating units of adjacent odd-numbered repeating unit rows or adjacent even-numbered repeating unit rows in the same column in the direction of the second diagonal is greater than 1.5 times the length of the first sub-pixel or the second sub-pixel in the direction of the second diagonal; or the plurality of repeating units form a plurality of repeating unit columns, each of the repeating unit columns including a plurality of repeating units that are arranged in a direction of the first diagonal, the plurality of repeating unit columns being arranged in a direction of the second diagonal; and a minimum length of a line connecting centers of mutually-proximate third sub-pixels of two repeating units of adjacent odd-numbered repeating units or adjacent even-numbered repeating unit columns in the same row is greater than 1.5 times the length of the first sub-pixel or the second sub-pixel in the direction of the second diagonal.

Optionally, in the display substrate according to an embodiment of the present disclosure, in each of the repeating units, a minimum distance between boundaries of the two third sub-pixels is in a direction of the second diagonal is greater than or equal to a minimum distance in a direction of the first diagonal between a boundary of the first sub-pixel in a first repeating unit and a boundary of the second sub-pixel in a second repeating unit, the first repeating unit being adjacent to the second repeating unit in the direction of the first diagonal, and the first sub-pixel in the first repeating unit being adjacent to the second sub-pixel in the second repeating unit.

Optionally, in the display substrate according to an embodiment of the present disclosure, the parallelogram is a diamond.

Optionally, in the display substrate according to an embodiment of the present disclosure, the direction of the first diagonal is parallel to the first direction, and the direction of the second diagonal is parallel to the second direction.

Optionally, in the display substrate according to an embodiment of the present disclosure, the plurality of repeating units form a plurality of repeating unit rows, each of the repeating unit rows including a plurality of repeating units that are arranged in a direction of the first diagonal, the plurality of repeating unit rows being arranged in a direction of the second diagonal, and a center of an interval of two adjacent repeating units of an odd-numbered repeating unit row in the direction of the first diagonal is located on an extension line of a line connecting the centers of the two third sub-pixels of an even-numbered repeating unit row; or the plurality of repeating units form a plurality of repeating unit columns, each of the repeating unit columns including a plurality of repeating units that are arranged in a direction of the first diagonal, the plurality of repeating unit columns being arranged in a direction of the second diagonal, and a center of an interval of two adjacent repeating units of an odd-numbered repeating unit column in the direction of the first diagonal is located on an extension line of a line connecting the centers of the two third sub-pixels of an even-numbered repeating unit column.

Optionally, in the display substrate according to an embodiment of the present disclosure, the length of the first sub-pixel in a direction of the second diagonal is greater than the length of the first sub-pixel in the direction of the first diagonal, and the length of the second sub-pixel in a direction of the second diagonal is greater than the length of the second sub-pixel in the direction of the first diagonal.

Optionally, in the display substrate according to an embodiment of the present disclosure, in each of the repeating units, the minimum distance between the boundaries of the two third sub-pixels in the direction of the second diagonal is in the range of 8 to 14 microns.

Optionally, in the display substrate according to an embodiment of the present disclosure, the first sub-pixel, the second sub-pixel and the third sub-pixel each include an anode, and the plurality of primary signal lines and the auxiliary signal line are located in the same layer as the anode.

Optionally, in the display substrate according to an embodiment of the present disclosure, the first sub-pixel is a blue sub-pixel, the second sub-pixel is a red sub-pixel, and the third sub-pixel is a green sub-pixel.

Optionally, extending directions of the plurality of primary signal lines are the same, and an extending direction of the auxiliary signal line is different from the extending direction of the plurality of primary signal lines;

the extending directions of the plurality of primary signal lines are the second direction, the primary signal lines have a shape of wave, and on the same side of the primary signal line, a peak portion of the wave is adjacent to the first sub-pixel, and a trough portion of the wave is adjacent to the second sub-pixel;

in the first direction, in the repeating units, the first sub-pixel and the second sub-pixel are respectively located on two sides of the two third sub-pixels;

with respect to each of the repeating units, the center of the first sub-pixel and the center of the second sub-pixel respectively coincide with the two vertices of the first diagonal of the parallelogram, and the centers of the two third sub-pixels respectively coincide with the two vertices of the second diagonal of the parallelogram;

in each of the repeating units, a minimum distance between boundaries of the two third sub-pixels is in a direction of the second diagonal is greater than or equal to a minimum distance in a direction of the first diagonal between a boundary of the first sub-pixel in a first repeating unit and a boundary of the second sub-pixel in a second repeating unit, the first repeating unit being adjacent to the second repeating unit in the direction of the first diagonal, and the first sub-pixel in the first repeating unit being adjacent to the second sub-pixel in the second repeating unit;

the first diagonal is greater than the second diagonal;

a length of the second diagonal is greater than half of the length of the first sub-pixel in a direction of the second diagonal;

a length of the second diagonal is greater than half of the length of the second sub-pixel in the direction of the second diagonal;

the parallelogram is a diamond;

a direction of the first diagonal is parallel to the first direction, and a direction of the second diagonal is parallel to the second direction;

the length of the first sub-pixel in a direction of the second diagonal is greater than the length of the first sub-pixel in a direction of the first diagonal, and the length of the second sub-pixel in the direction of the second diagonal is greater than the length of the second sub-pixel in the direction of the first diagonal;

in each of the repeating units, the minimum distance between the boundaries of the two third sub-pixels in the direction of the second diagonal is in the range of 8 to 14 microns;

the display substrate satisfies at least one of the following conditions:

the plurality of primary signal lines, the auxiliary signal line, an anode of the first sub-pixel, an anode of the second sub-pixel and an anode of the third sub-pixel are located in the same layer;

the first direction is perpendicular to the second direction; and the first sub-pixel is a blue sub-pixel, the second sub-pixel is a red sub-pixel, and the third sub-pixel is green sub-pixel; and the plurality of repeating units satisfy the following condition:

the plurality of repeating units form a plurality of repeating unit rows, each of the repeating unit rows including a plurality of repeating units that are arranged in the direction of the first diagonal, the plurality of repeating unit rows being arranged in the direction of the second diagonal; the auxiliary signal line comprises a first line segment, a second line segment, and a third line segment, the third line segment extending in the first direction, the first line segment being located between the first sub-pixel and the second sub-pixel directly adjacent to the first sub-pixel in an adjacent repeating unit row, the third line segment being located between two third sub-pixels in the same repeating unit, and one end of the second line segment being connected to the first line segment, and the other end of the second line segment being connected to the third line segment; a projection of the third line segment of the auxiliary signal line located in an odd-numbered repeating unit row in the second direction does not overlap a projection of the third line segment of the auxiliary signal line located in an even-numbered repeating unit row in the second direction; the plurality of repeating units form a plurality of repeating unit rows, each of the repeating unit rows including a plurality of repeating units that are arranged in a direction of the first diagonal, the plurality of repeating unit rows being arranged in a direction of the second diagonal; a minimum length of a line connecting centers of mutually-proximate third sub-pixels of two repeating units of adjacent odd-numbered repeating unit rows or adjacent even-numbered repeating unit rows in the same column in the direction of the second diagonal is greater than 1.5 times the length of the first sub-pixel or the second sub-pixel in the direction of the second diagonal; the plurality of repeating units form a plurality of repeating unit rows, each of the repeating unit rows including a plurality of repeating units that are arranged in a direction of the first diagonal, the plurality of repeating unit rows being arranged in a direction of the second diagonal, and a center of an interval of two adjacent repeating units of an odd-numbered repeating unit row in the direction of the first diagonal is located on an extension line of a line connecting the centers of the two third sub-pixels of an even-numbered repeating unit row; or the plurality of repeating units form a plurality of repeating unit columns, each of the repeating unit columns including a plurality of repeating units that are arranged in the direction of the first diagonal, and the plurality of repeating unit columns being arranged in the direction of the second diagonal; the auxiliary signal line includes a first line segment, a second line segment, and a third line segment, the third line segment extending in the first direction, the first line segment being located between the first sub-pixel and the second sub-pixel directly adjacent to the first sub-pixel in an adjacent repeating unit column, the third line segment being located between two third sub-pixels in the same repeating unit, and one end of the second line segment being connected to the first line segment, and the other end of the second line segment being connected to the third line segment; a projection of the third line segment of the auxiliary signal line located in an odd-numbered repeating unit column in the second direction does not overlap a projection of the third line segment of the auxiliary signal line located in an even-numbered repeating unit column in the second direction; the plurality of repeating units form a plurality of repeating unit columns, each of the repeating unit columns including a plurality of repeating units that are arranged in a direction of the first diagonal, the plurality of repeating unit columns being arranged in a direction of the second diagonal; a minimum length of a line connecting centers of mutually-proximate third sub-pixels of two repeating units of adjacent odd-numbered repeating units or adjacent even-numbered repeating unit columns in the same row is greater than 1.5 times the length of the first sub-pixel or the second sub-pixel in the direction of the second diagonal; the plurality of repeating units form a plurality of repeating unit columns, each of the repeating unit columns including a plurality of repeating units that are arranged in a direction of the first diagonal, the plurality of repeating unit columns being arranged in a direction of the second diagonal, and a center of an interval of two adjacent repeating units of an odd-numbered repeating unit column in the direction of the first diagonal is located on an extension line of a line connecting the centers of the two third sub-pixels of an even-numbered repeating unit column.

At least one embodiment of the present disclosure further provides a display substrate. The display substrate includes: a plurality of pixel groups, a plurality of primary signal lines, and an auxiliary signal line. Each of the pixel groups includes two first sub-pixels, two second sub-pixels, and two third sub-pixels. In each of the pixel groups, lines connecting centers of the two first sub-pixels and centers of the second sub-pixels form a rectangle. The rectangle includes a first axis of symmetry and a second axis of symmetry perpendicular to the first axis of symmetry. The two third sub-pixels are arranged in a direction of the second axis of symmetry and are respectively located on two sides of the first axis of symmetry. The plurality of pixel groups form a pixel group column in the direction of the second axis of symmetry. In the direction of the second axis of symmetry, two adjacent pixel groups share a first sub-pixel and a second sub-pixel. In each of the pixel groups, the two third sub-pixels are located between two adjacent primary signal lines. At least one auxiliary signal line is disposed between the two adjacent primary signal lines. Two ends of the auxiliary signal line are respectively electrically connected to the two adjacent primary signal lines, and the two third sub-pixels are respectively located on two sides of the auxiliary signal line.

Optionally, in the display substrate according to an embodiment of the present disclosure, a distance between centers of two adjacent pixel groups located in adjacent pixel group columns in the direction of the second axis of symmetry is half the length of the rectangle in the direction of the second axis of symmetry.

Optionally, in the display substrate according to an embodiment of the present disclosure, the two third sub-pixels are symmetrically disposed about the first axis of symmetry.

Optionally, in the display substrate according to an embodiment of the present disclosure, centers of the two third sub-pixels are located on the second axis of symmetry.

Optionally, in the display substrate according to an embodiment of the present disclosure, the plurality of primary signal lines are configured to supply a reference voltage or a common voltage to the plurality of pixel groups.

Optionally, in the display substrate according to an embodiment of the present disclosure, shapes of the first sub-pixel and the second sub-pixel are both a hexagon, and shapes of the two third sub-pixels are both a pentagon.

At least one embodiment of the present disclosure further provides a display device. The display device includes the display substrate as described above.

BRIEF DESCRIPTION OF THE DRAWINGS

For clearer illustration of the technical solutions of the embodiments of the present disclosure, the drawings of the embodiments are briefly described hereinafter. It is obvious that the drawings in the following description relate only to some embodiments of the present disclosure, rather than a limitation to the present disclosure.

DETAILED DESCRIPTION

The technical solutions and technical effects of the embodiments of the present disclosure are described clearly and completely with reference to the accompanying drawings in the embodiments of the present disclosure, to present the objects, technical solutions, and advantages of the embodiments of the present disclosure more clearly. It is apparent that the described embodiments are only a part of exemplary embodiments of the present disclosure, rather than all the embodiments. According to the described exemplary embodiments of the present disclosure, all of the other embodiments obtained by a person skilled in the art without consuming any creative work fall within the protection scope of the present disclosure.

Unless otherwise defined, technical terms or scientific terms used herein shall be taken to mean the ordinary meanings as understood by the ordinary skill in the art to which the present disclosure belongs. The terms "first", "second" and the like used in the description and claims of the present disclosure do not denote any order, quantity, or importance, but are merely used to distinguish different components. Similarly, the terms "a", "an" and "the", and the like are not intended to limit the number, but to denote the number of at least one. The terms "comprise", "include" and the like are intended to mean that the elements or objects before said term cover the elements or objects or equivalents listed after said term, without excluding other elements or objects. The terms "upper", "lower" and the like are only used to indicate the relative positional relationship, and when the absolute position of a described object changes, the relative positional relationship may also change accordingly.

An embodiment of the present disclosure provides a display substrate and a display device. By gridding signal lines for routing, the stability of a reference voltage signal is improved and thus the display effect of the display panel is enhanced.

The embodiments of the present disclosure are described in detail below with reference to the drawings, but the present disclosure is not limited to the specific embodiments.

Figure 1:
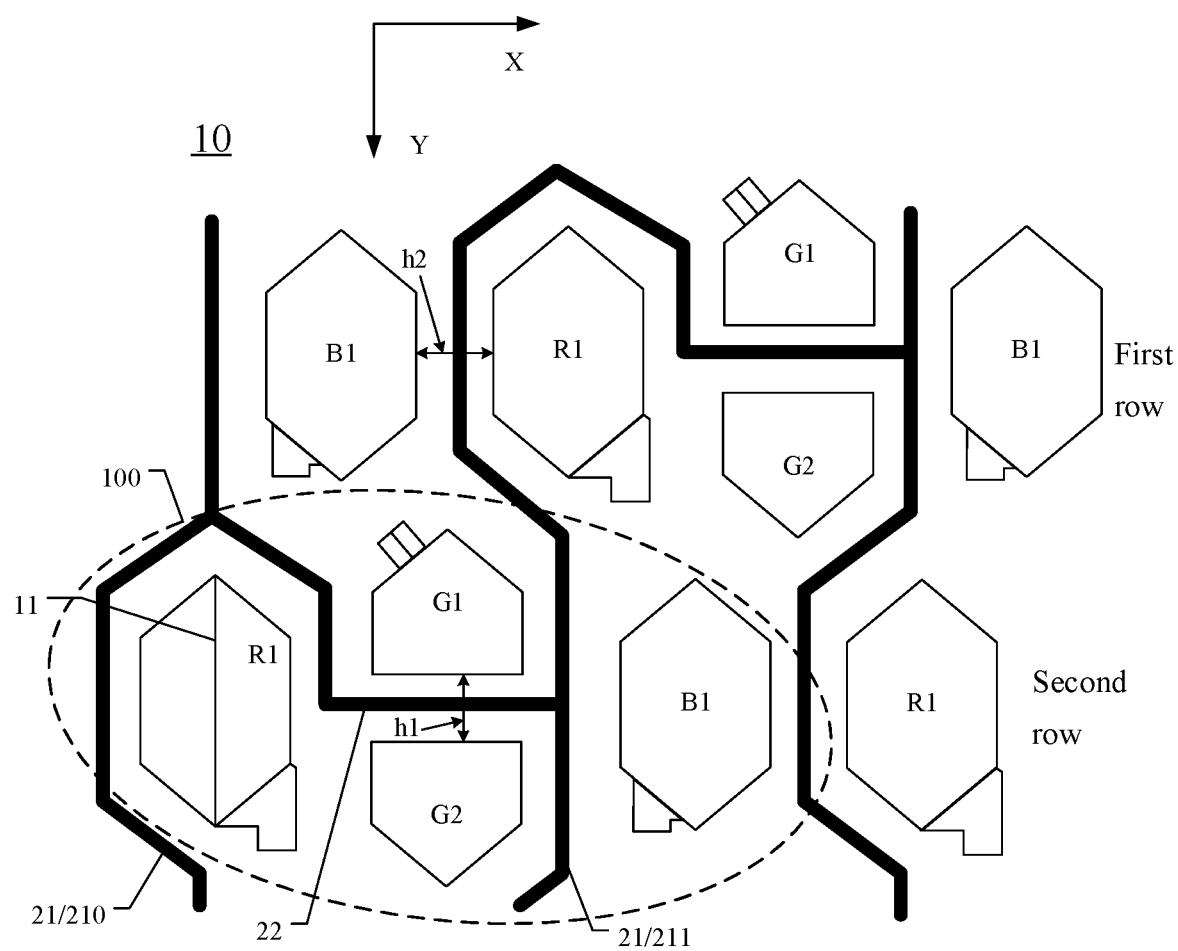
FIG. 1 is a partial diagram of a display substrate according to an embodiment of the present disclosure.
Figure 2:
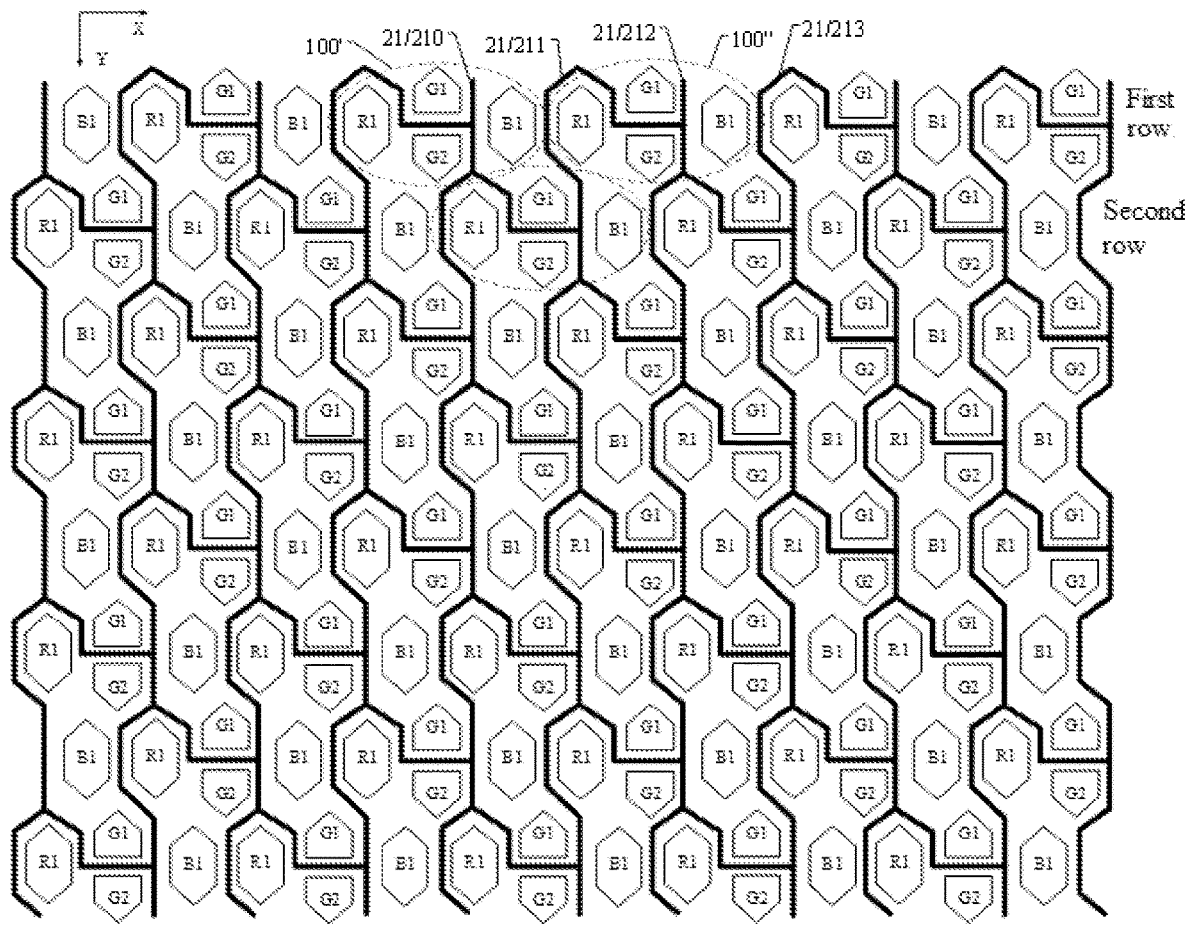
FIG. 2 is an array diagram of a display substrate according to an embodiment of the present disclosure.
Figure 3:
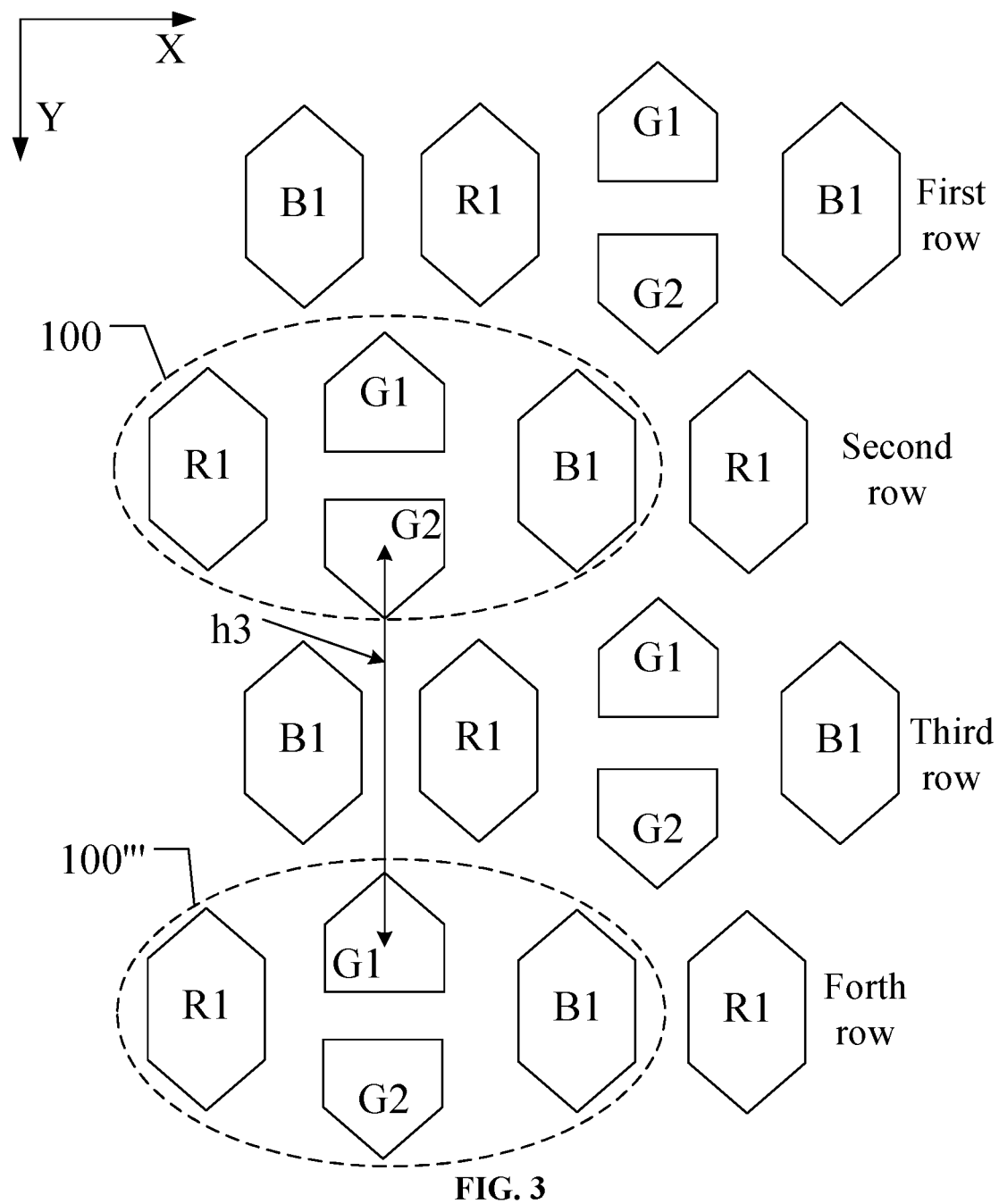
FIG. 3 is a partial array diagram of a display substrate according to an embodiment of the present disclosure.
Figure 4:
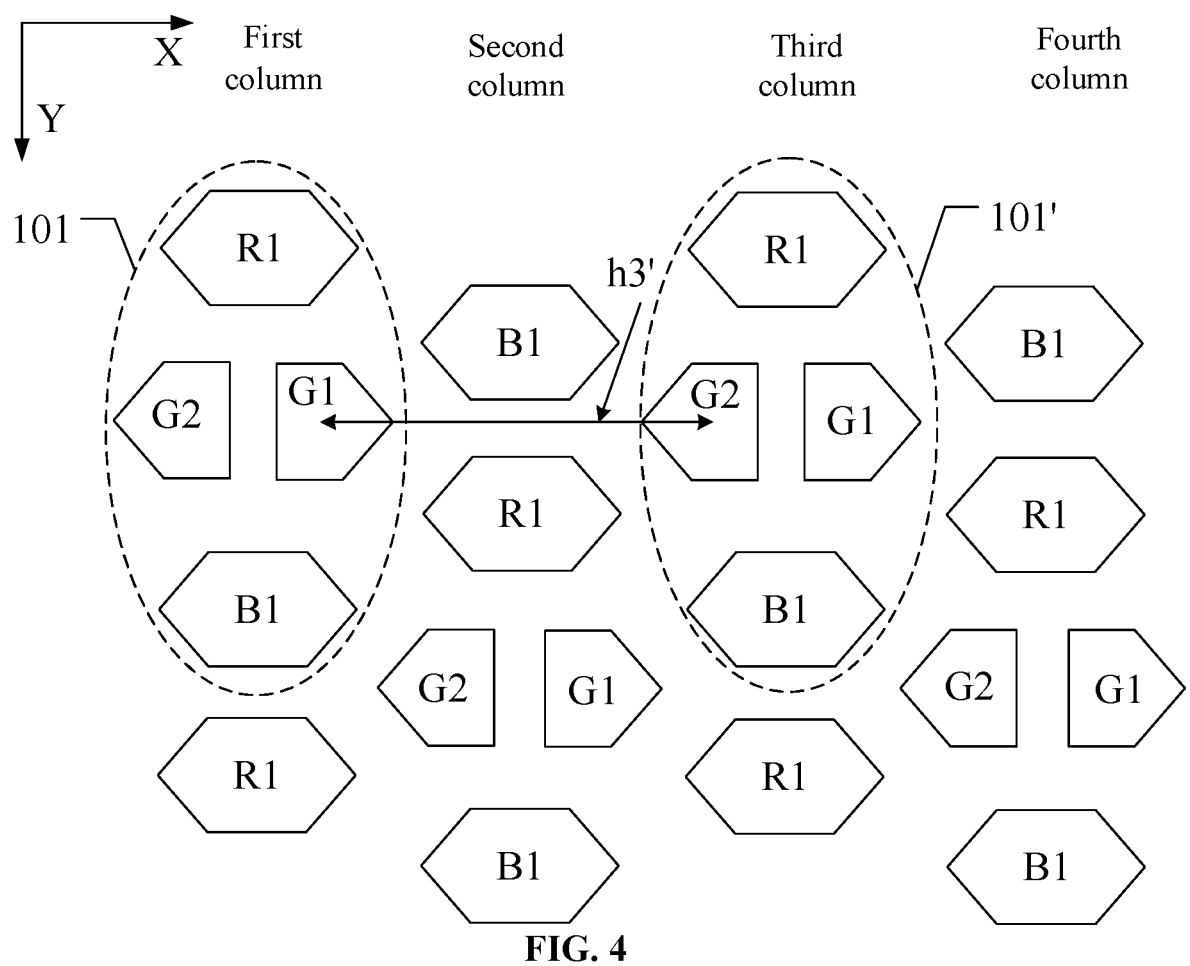
FIG. 4 is a partial array diagram of another display substrate according to an embodiment of the present disclosure.
Figure 5:
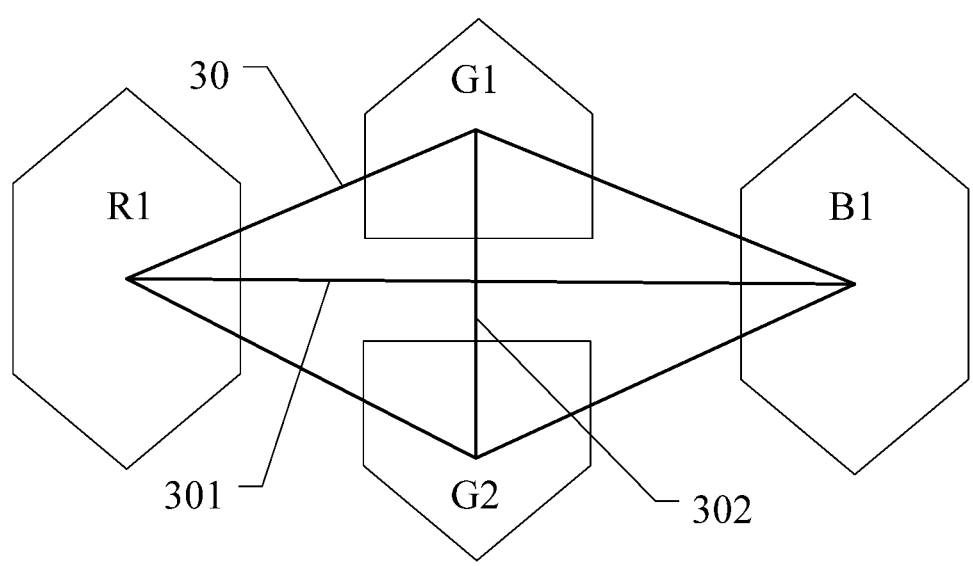
FIG. 5 is a schematic structural diagram of a repeating unit in the display substrate shown in FIG. 1.

FIG. 1 is a partial diagram of a display substrate according to an embodiment of the present disclosure. FIG. 2 is an array diagram of a display substrate according to an embodiment of the present disclosure. FIG. 3 is a partial array diagram of a display substrate according to an embodiment of the present disclosure. FIG. 4 is a partial array diagram of another display substrate according to an embodiment of the present disclosure. FIG. 5 is a schematic structural diagram of a repeating unit in the display substrate shown in FIG. 1.

As shown in FIG. 1, the display substrate 10 according to an embodiment of the present disclosure includes a plurality of repeating units 100, a plurality of primary signal lines 21, and a plurality of auxiliary signal lines 22. Each of the repeating units 100 includes a first sub-pixel R1, a second sub-pixel B1, and two third sub-pixels G1 and G2 that are spaced apart. In each of the repeating units 100, the first sub-pixel R1 and the second sub-pixel B1 are arranged in a first direction X, and the two third sub-pixels G1 and G2 are arranged in a second direction Y. The first direction X is different from the second direction Y. The two third sub-pixels G1 and G2 are located between two adjacent primary signal lines 21. At least one auxiliary signal line 22 is disposed between the two adjacent primary signal lines 21. The auxiliary signal line 22 is connected to the two adjacent primary signal lines 21 and passes through an interval between the two third sub-pixels G1 and G2. That is, two ends of the auxiliary signal line are respectively connected to two adjacent primary signal lines 21, and the two third sub-pixels G1 and G2 are respectively located on two sides of the auxiliary signal line 22.

Optionally, four sub-pixels in each of the repeating units 100 form two pixels. The first sub-pixel and the second sub-pixel in the repeating unit 100 are shared by the two pixels, respectively. That is, one pixel formed by the repeating unit 100 includes a first sub-pixel R1, a second sub-pixel B1 and a third sub-pixel G1, and another pixel formed by the repeating unit 100 includes a first sub-pixel R1, a second sub-pixel B1 and another third sub-pixel G2. The pixels in the plurality of repeating units 100 form a pixel array. In a first direction of the pixel array, the sub-pixel density is 1.5 times the virtual pixel density. In a second direction of the pixel array, the sub-pixel density is 1.5 times the virtual pixel density.

It should be noted that, first since the first sub-pixel and the second sub-pixel are shared by two adjacent pixels, the boundary of each pixel is blurred. Thus, the embodiment of the present disclosure does not limit the shape of each pixel. The pixel in the embodiment of the present disclosure is not a pixel in a strict sense, i.e., a pixel in the embodiment of the present disclosure includes a red sub-pixel, a green sub-pixel and a blue sub-pixel. Therefore, the pixel in the present disclosure may be referred to as a virtual pixel.

Second, those skilled in the art should know that, based on the pixel arrangement structure of the present disclosure, the pixels and the first sub-pixel, the second sub-pixel, and the third sub-pixel in each pixel should be distributed as uniformly as possible.

Third, the first direction and the second direction identified in the drawings of the embodiments of the present disclosure are all identified from a macroscopic perspective, i.e., since it is to be realized that the sub-pixel density is 1.5 times the pixel density, and at the same time it is to be guaranteed that the pixels and the sub-pixels in the pixels are uniformly distributed as a whole, the first direction from a microscopic perspective may not be a straight line but a wavy line, as is the second direction.

Optionally, the first sub-pixel R1, the two third sub-pixels G1 and G2, and the second sub-pixel B1 in the repeating unit 100 are sequentially arranged in the first direction X. That is, in the first direction X, the first sub-pixel R1 and the second sub-pixel G1 in the repeating unit 100 are respectively located on two sides of the two third sub-pixels G1 and G2. That is, the two third sub-pixels G1 and G2 are located between the first sub-pixel R1 and the second sub-pixel B1.

Optionally, the first direction X and the second direction Y are respectively two directions perpendicular to each other in the same plane, i.e., the first direction X and the second direction Y may be perpendicular to each other.

Optionally, referring to FIG. 1, in each of the repeating units 100, the interval between the two third sub-pixels G1 and G2 is provided with an auxiliary signal line 22. The auxiliary signal line 22 passes through the interval between the two third sub-pixels G1 and G2.

Optionally, for four sub-pixels in a repeating unit 100, two vertices of a first diagonal of a parallelogram are respectively located in the first sub-pixel R1 and the second sub-pixel B1, and two vertices of a second diagonal of the parallelogram are located in the two third sub-pixels G1 and G2, respectively. In some examples, as shown in FIG. 5, in each of the repeating units 100, lines connecting the center of the first sub-pixel R1, the center of the second sub-pixel B1, and centers of the two third sub-pixels G1 and G2 form a parallelogram 30. The center of the first sub-pixel R1 and the center of the second sub-pixel B1 coincide with two vertices of a first diagonal 301 of the parallelogram 30, respectively. The centers of the two third sub-pixels G1 and G2 coincide with two vertices of a second diagonal 302 of the parallelogram 30.

In addition, in the embodiment of the present disclosure, unless otherwise specified, the "center" (e.g., the theoretical center) of a sub-pixel may refer to the geometric center of the ideal shape of the sub-pixel (e.g., the first sub-pixel, the second sub-pixel, or the third sub-portion). During designing of a pixel arrangement structure, the sub-pixel is typically designed in a regular shape, such as a hexagon, a pentagon, a trapezoid, or other shape. During design, the center of the sub-pixel may be the geometric center of the regular shape described above. However, in the actual manufacturing process, the shape of the formed sub-pixel generally deviates from the regular shape of the above design. For example, the corners of the above regular shape may become rounded, and therefore, the shape of the sub-pixel may be a rounded figure. The shape of the actually fabricated sub-pixel may also have other variations from the shape of the design. For example, the shape of a sub-pixel designed as a hexagon may become an approximately elliptical shape in actual fabrication. Therefore, the center of the sub-pixel may not be the strict geometric center of the irregular shape of the sub-pixel formed. In an embodiment of the present disclosure, the center of the sub-pixel may have a certain offset from the geometric center of the shape of the sub-pixel. The center of the sub-pixel refers to any point in the area enclosed by specific points on radiant line segments from the geometric center of the sub-pixel to points on the edge of the sub-pixel. The specific point on the radiant line segment is at ⅓ the length of the radiation line segment from the geometric center. The definition of the center of the sub-pixel applies to the center of the sub-pixel shape of the regular shape, and also to the center of the sub-pixel of the irregular shape.

As described above, the shape of the actually fabricated sub-pixel may deviate from the shape of the designed sub-pixel due to various manufacturing errors. Therefore, the position of the center of the sub-pixel and the relationship between the center of the sub-pixel and the positions of other objects in the present disclosure may also have certain errors in the embodiment of the present disclosure. For example, it is proper that a line connecting the centers of sub-pixels or a line passing through the center of a sub-pixel pass through the area enclosed by the specific points of the radiant line segments if the lines satisfy other corresponding definitions (e.g., the extending direction). As another example, the center of the sub-pixel being located on a certain line means that the line passes through the area enclosed by the specific points of the above-mentioned radiant line segments. Furthermore, the coincidence described in the embodiment of the present disclosure means that at least 70% of the area of the corresponding sub-pixel or other component may coincide. The mirror symmetry described in the embodiment of the present disclosure means at least 70% of the area of the corresponding sub-pixel may coincide after a mirroring operation.

Optionally, as shown in FIG. 5, the first diagonal 301 is longer than the second diagonal 302.

Optionally, as shown in FIG. 5, the first diagonal 301 and the second diagonal 302 are perpendicular to each other. The direction of the first diagonal 301 is parallel to the first direction X, and the direction of the second diagonal 302 is parallel to the second direction Y.

Optionally, as shown in FIGS. 2 and 5, the first direction X is a row direction, and the second direction Y is a column direction. The plurality of repeating units 100 are repeatedly arranged in the direction of the first diagonal 301 (i.e., the first direction X) to form a repeating unit row. A plurality of repeating unit rows are arranged in the direction of the second diagonal 302 (i.e., the second direction Y). That is, the plurality of repeating units 100 are arranged in an array in the direction of the first diagonal 301 (i.e., the first direction X) and the direction of the second diagonal 302 (i.e., the second direction Y).

Optionally, as shown in FIG. 3, the plurality of repeating units 100 form a plurality of repeating unit rows. Each of the repeating unit rows includes a plurality of repeating units 100 that are arranged in a direction of the first diagonal 301. The plurality of repeating units rows are arranged in a direction of the second diagonal 302. The length h3 of a line connecting the centers of the mutually-proximate third sub-pixels in two repeating units of adjacent odd-numbered repeating unit rows or adjacent even-numbered repeating unit rows in the same column in the direction of the second diagonal 302 (i.e., the second direction Y) is greater than 1.5 times the length of the first sub-pixel R1 or the second sub-pixel B1 in the direction of the second diagonal 302. For example, as shown in FIG. 3, in some examples, the two third sub-pixels G1 and G2 are sequentially arranged in the second direction Y. A repeating unit 100 and a repeating unit 100''' are located in the same column. The repeating unit 100 is located in the second row. The repeating unit 100''' is located in the fourth row. Thus, the repeating unit 100 and the repeating unit 100''' are two repeating units located in adjacent even-numbered repeating unit rows and in the same column. In the repeating unit 100 and the repeating unit 100''', the mutually-proximate third sub-pixels are the third sub-pixel G2 in the repeating unit 100 and the third sub-pixel G1 in the repeating unit 100'''. The minimum length h3 represents the length of a line connecting the centers of the third sub-pixel G2 in the repeating unit 100 and the third sub-pixel G1 in the repeating unit 100'''.

For example, in the example illustrated in FIG. 3, the first sub-pixel R1, the two third sub-pixels G1 and G2, and the second sub-pixel B1 of each of the repeating units 100 are sequentially arranged in the first direction X, which is not limited herein. As shown in FIG. 4, the first sub-pixel R1, the two third sub-pixels G1 and G2, and the second sub-pixel B1 of each of the repeating units 100 may still be sequentially arranged in the first direction X, where the first direction X is a column direction, and the second direction Y is a row direction. That is, the repeating unit 100 shown in FIG. 3 is rotated by 90 degrees as a whole to obtain the repeating unit shown in FIG. 4. The plurality of repeating units 100 are repeatedly arranged in the direction of the first diagonal (i.e., the first direction X) to form a repeating unit column. A plurality of repeating unit columns are arranged in the direction of the second diagonal (i.e., the second direction Y). In the example shown in FIG. 4, the plurality of repeating units 100 form a plurality of repeating unit columns. Each of the repeating unit columns includes a plurality of repeating units 100 that are arranged in a direction of the first diagonal 301. The plurality of repeating unit columns are arranged in a direction of the second diagonal 302. The length h3' of a line connecting centers of third sub-pixels of two repeating units of adjacent odd-numbered repeating unit columns or even-numbered repeating unit columns in the same row in the direction of the second diagonal (i.e., the second direction Y) is greater than 1.5 times the length of the first sub-pixel R1 or the second sub-pixel B1 in the direction of the second diagonal (i.e., the second direction Y).

Optionally, as shown in FIG. 3, in some examples, the two third sub-pixels G1 and G2 are sequentially arranged in the second direction Y. A repeating unit 101 and a repeating unit 101' are located in the same row. The repeating unit 101 is located in the first column. The repeating unit 101' is located in the third column. Thus, the repeating unit 101 and the repeating unit 101' are two repeating units located in adjacent odd-numbered repeating unit columns and in the same row. The mutually-proximate third sub-pixel in the repeating unit 101 and the repeating unit 101' are the third sub-pixel G1 in the repeating unit 101 and the third sub-pixel G2 in the repeating unit 101'. Therefore, the minimum length h3' represents the length of a line connecting the centers of the third sub-pixel G1 in the repeating unit 101 and the third sub-pixel G2 in the repeating unit 101'.

It should be noted that, for the sake of clarity, the primary signal line and the auxiliary signal line are not shown in the display substrate shown in FIGS. 3 and 4.

Optionally, as shown in FIG. 5, the length of the second diagonal 302 is greater than half the length of the first sub-pixel R1 or the second sub-pixel B1 in the direction of the second diagonal 302. In the embodiment of the present disclosure, the length of the second diagonal 302 satisfies at least one of the following conditions: the length of the second diagonal 302 is greater than half of the length of the first sub-pixel R1 in the direction of the second diagonal; and the length of the second diagonal 302 is greater than half of the length of the second sub-pixel B1 in the direction of the second diagonal 302.

For example, as shown in FIGS. 1 and 5, in each of the repeating units 100, the minimum distance h1 between boundaries of the two third sub-pixels G1 and G2 in the direction of the second diagonal 302 (i.e., the second direction Y) is greater than or equal to the minimum distance h2 in the direction of the first diagonal 301 between a boundary of the first sub-pixel R1 and a boundary of the adjacent second sub-pixel B1 of two adjacent repeating units in the direction of the first diagonal 301 (i.e., the first direction X). For example, the first repeating unit and the second repeating unit are adjacent to each other in the direction of the first diagonal 301, and the first sub-pixel R1 in the first repeating unit and the second sub-pixel B1 in the second repeating unit are adjacent to each other. In this case, the minimum distance h1 between boundaries of the two third sub-pixels G1 and G2 in the direction of the second diagonal 302 is greater than or equal to the minimum distance h2 between a boundary of the first sub-pixel R1 in the first repeating unit and a boundary of the second sub-pixel B1 in the second repeating unit in the direction of the first diagonal 301.

In the embodiment of the present disclosure, the length of each sub-pixel in the direction of the first diagonal or the direction of the second diagonal indicates the maximum distance of each sub-pixel in the direction of the first diagonal or in the direction of the second diagonal. Taking the first sub-pixel R1 as an example, when the shape of the first sub-pixel R1 is a rectangle, the maximum distance of the first sub-pixel R1 in the direction of the first diagonal is the side length of the rectangle in the first direction X. The maximum distance of the first sub-pixel R1 in the direction of the second diagonal is the side length of the rectangle in the second direction Y. When the shape of the first sub-pixel R1 is a long ellipse, and a line connecting two focal points of the long ellipse is substantially parallel to the second direction Y, the maximum distance of the first sub-pixel R1 in the direction of the second diagonal is the distance between two intersections of the line connecting the two focal points with the circumference of the long ellipse, and the maximum distance of the first sub-pixel R1 in the direction of the first diagonal is the distance between two intersections of the vertical line of the line connecting the two focal points with the circumference of the long ellipse.

Optionally, the parallelogram 30 may be a diamond. That is, the center of the first sub-pixel R1 and the center of the second sub-pixel B1 are symmetrically disposed with respect to the second diagonal 302, and the centers of the two third sub-pixels G1 are symmetrically disposed with respect to the first diagonal 301.

It should be noted that the parallelogram described above is for better describing the positions of the first sub-pixel, the second sub-pixel, and the third sub-pixel, and is not an actual structure.

Optionally, as shown in FIG. 1, FIG. 3 and FIG. 5, a plurality of repeating units 100 are repeatedly arranged in the direction of the first diagonal 301 (i.e., the first direction X) to form a repeating unit row. A plurality of repeating unit rows are arranged in the direction of the second diagonal 302 (i.e., the second direction Y). The center of an interval of two adjacent repeating units 100 of an odd-numbered row in the direction of the first diagonal 301 is located on an extension line of a line (i.e., the second diagonal 302) connecting centers of two third sub-pixels G1 and G2 in a repeating unit 100 in an even-numbered row. The center of an interval of two adjacent repeating units 100 of an even-numbered row is located on an extension line of a line (i.e., the second diagonal 302) connecting centers of two third sub-pixels G1 and G2 in a repeating unit 100 in an odd-numbered row.

Optionally, as shown in FIG. 1, FIG. 4 and FIG. 5, a plurality of repeating units 100 are repeatedly arranged in the direction of the first diagonal 301 (i.e., the first direction X) to form a repeating unit column. A plurality of repeating unit columns are arranged in the direction of the second diagonal 302 (i.e., the second direction Y). The center of an interval of two adjacent repeating units in an odd-numbered column in the direction of the first diagonal 301 is located on an extension line of a line connecting centers of two third sub-pixels G1 and G2 of an even-numbered column.

Optionally, the plurality of primary signal lines 21 extend in the same direction, and an extending direction of the auxiliary signal line 22 is different from extending directions of the plurality of primary signal lines 21. As shown in FIG. 2, on the entire display substrate, a plurality of primary signal lines 21 and a plurality of auxiliary signal lines 22 are arranged in a grid shape, and the plurality of primary signal lines 21 are electrically connected to the plurality of auxiliary signal lines 22. For example, as shown in FIGS. 1 and 2, the auxiliary signal line 22 extends in the first direction X, and the plurality of primary signal lines 21 extend in the second direction Y. In the embodiment of the present disclosure, "extend" represents a general routing direction of the plurality of primary signal lines 21 and the auxiliary signal line 22. However, as shown in FIG. 2, the plurality of primary signal lines 21 are not straight lines at the microscopic level, but extend in the second direction Y in a waved shape; and the auxiliary signal line 22 is not a straight line either at the microscopic level, but extends in the first direction X in a waved shape.

Optionally, as shown in FIG. 2, the extending direction of each primary signal line 21 is the second direction Y. The shape of each primary signal line 21 is a wave. On the same side of the primary signal line 21 (e.g., the right side in FIG. 2), if a peak portion the primary signal line in the wave shape is adjacent to the first sub-pixel R1, a trough portion of the primary signal line in the wave shape is adjacent to the second sub-pixel B1. For example, on the other side of the primary signal line 21 (e.g., the left side in FIG. 2), if the peak portion of the wave is adjacent to the second sub-pixel B1, the trough portion of the primary signal line in the wave shape is adjacent to the two third sub-pixels G1 and G2. That is, the peak portion of the primary signal line is located between the first sub-pixel R1 and the second sub-pixel B1 in the same repeating unit row, and the trough portion of the primary signal line is located between the two third sub-pixels and the second sub-pixel in the same repeating unit row. It should be noted that, as shown in FIG. 2, in some embodiments of the present disclosure, a portion of the wavy primary signal lines 21 that protrudes to the right represents a trough, and a portion of the wavy primary signal lines 21 that protrudes to the left represents a peak, which is not limited in the present disclosure. A portion of the wavy primary signal line 21 that protrudes to the right may also represent a peak, and at this time, a portion of the wavy primary signal line 21 that protrudes to the left represents a trough, such that on the same side of the primary signal line 21 (e.g., the right side in FIG. 2), the peak portion of the wave is adjacent to the second sub-pixel B1, and the trough portion of the wave is adjacent to the first sub-pixel R1. It should be noted that, in the same repeating unit, the first sub-pixel B1 is located on the left side of the two third sub-pixels G1 and G2, and the second sub-pixel B1 is located on the right side of the two third sub-pixels G1 and G2.

Optionally, a portion of the primary signal line 21 corresponding to an even-numbered repeating unit row is a peak, and a portion of the primary signal line 21 corresponding to an odd-numbered repeating unit row is a trough; or, a portion of the primary signal line 21 corresponding to an odd-numbered repeating unit row is a peak, and a portion of the primary signal line 21 corresponding to an even-numbered repeating unit row is a trough.

Optionally, if the plurality of primary signal lines 21 are sequentially arranged in the first direction X, the peaks and troughs of two adjacent primary signal lines 21 correspond to each other. For example, as shown in FIG. 2, the plurality of primary signal lines 21 include a first primary signal line 210, a second primary signal line 211, a third primary signal line 212, and a fourth primary signal line 213. A portion of the first primary signal line 210 located in a first repeating unit row is a trough, a portion of the second primary signal line 211 located in the first repeating unit row is a peak, a portion of the third primary signal line 212 located in the first repeating unit row is a trough, and a portion of the fourth primary signal line 213 located in the first repeating unit row is a peak. Accordingly, a portion of the first primary signal line 210 located in a second repeating unit row is a peak, a portion of the second primary signal line 211 located in the second repeating unit row is a trough, a portion of the third primary signal line 212 located in the second repeating unit row is a peak, and a portion of the fourth primary signal line 213 located in the second repeating unit row is a trough.

Optionally, in each of the repeating units 100, the two third sub-pixels G1 and G2 are arranged in the extending direction of the primary signal line 21, i.e., the extending direction of the primary signal line 21 is the second direction Y, and in a direction perpendicular to the extending direction of the primary signal line 21 (i.e., in the first direction X), the first sub-pixel R1 and the second sub-pixel B1 are located on two sides of the two third sub-pixels G1 and G2, respectively. As shown in FIG. 1, in the first direction X, in the repeating unit 100, the first sub-pixel R1 is located on the left side of the two third sub-pixels G1 and G2, and the second sub-pixel B1 is located on the right side of the two third sub-pixels G1 and G2.

Optionally, the arrangement direction of the first sub-pixel R1, the second sub-pixel B1, and the two third sub-pixels G1 and G2 is perpendicular to the extending direction of the plurality of primary signal lines 21. As shown in FIG. 1, the arrangement direction of the first sub-pixel R1, the second sub-pixel B1, and the two third sub-pixels G1 and G2 is the first direction X. The extending direction of the plurality of primary signal lines 21 is the second direction Y. The first direction X and the second direction Y are perpendicular to each other.

Optionally, in the repeating unit 100 located in the second row, one of two adjacent primary signal lines 21 is located on a side of the first sub-pixel R1 distal from the two third sub-pixels G1 and G2, and the other of the two adjacent primary signal lines 21 is located on a side of the second sub-pixel B1 proximal to the two sub-pixels G1 and G2. As shown in FIGS. 1 and 2, the first primary signal line 210 and the second primary signal line 211 are two adjacent primary signal lines 21. In one example, in the repeating unit 100 located in the second row, the first primary signal line 210 is located on a side of the first sub-pixel R1 distal from the two third sub-pixels G1 and G2, and the second primary signal line 211 is located on a side of the second sub-pixel B1 proximal to the two sub-pixels G1 and G2. That is, in the first direction X, the first primary signal line 210 is located between two adjacent repeating units 100, and the second primary signal line 211 is located between the second sub-pixel B1 and the two third sub-pixels G1 and G2 in the repeating unit 100.

In another example, in the repeating unit 100 located in the second row, the first primary signal line 210 is located on a side of the first sub-pixel R1 proximal to the two third sub-pixels G1 and G2, and the second primary signal line 211 is located on a side of the second sub-pixel B1 distal from the two third sub-pixels G1 and G2. That is, in the first direction X, the first primary signal line 210 is located between the first sub-pixel R1 and the two third sub-pixels G1 and G2 in the repeating unit, and the second primary signal line 211 is located between two adjacent repeating units 100.

In still another example, in the repeating unit 100 located in the second row, one of the two adjacent primary signal lines 21 is located on a side of the first sub-pixel R1 proximal to the two third sub-pixels G1 and G2, and the other of the two adjacent primary signal lines 21 is located on a side of the second sub-pixel B1 proximal to the two third sub-pixels G1 and G2. That is, in the first direction X, the first primary signal line 210 is located between the first sub-pixel R1 and the two third sub-pixels G1 and G2 in the repeating unit, and the second primary signal line 211 is located between the second sub-pixel B1 and the two third sub-pixels G1 and G2 in the repeating unit 100.

It should be noted that, in the first row, the positional relationship of the first primary signal line 210 and the second primary signal line 211 is opposite to that described in the above example. That is, as shown in FIG. 2, the first row includes adjacent repeating unit 100' and repeating unit 100". In the first row, the first primary signal line 210 is located on a side of the second sub-pixel B1 of the repeating unit 100' proximal to the two sub-pixels G1 and G2, and the second primary signal line 211 is located on a side of the first sub-pixel R1 in the repeating unit 100" distal from the two third sub-pixels G1 and G2. That is, in the first direction X, the first primary signal line 210 is located between the second sub-pixel B1 and the two third sub-pixels G1 and G2 in the repeating unit 100', and the second primary signal line 211 is located between the adjacent repeating unit 100' and repeating unit 100".

Figure 6:
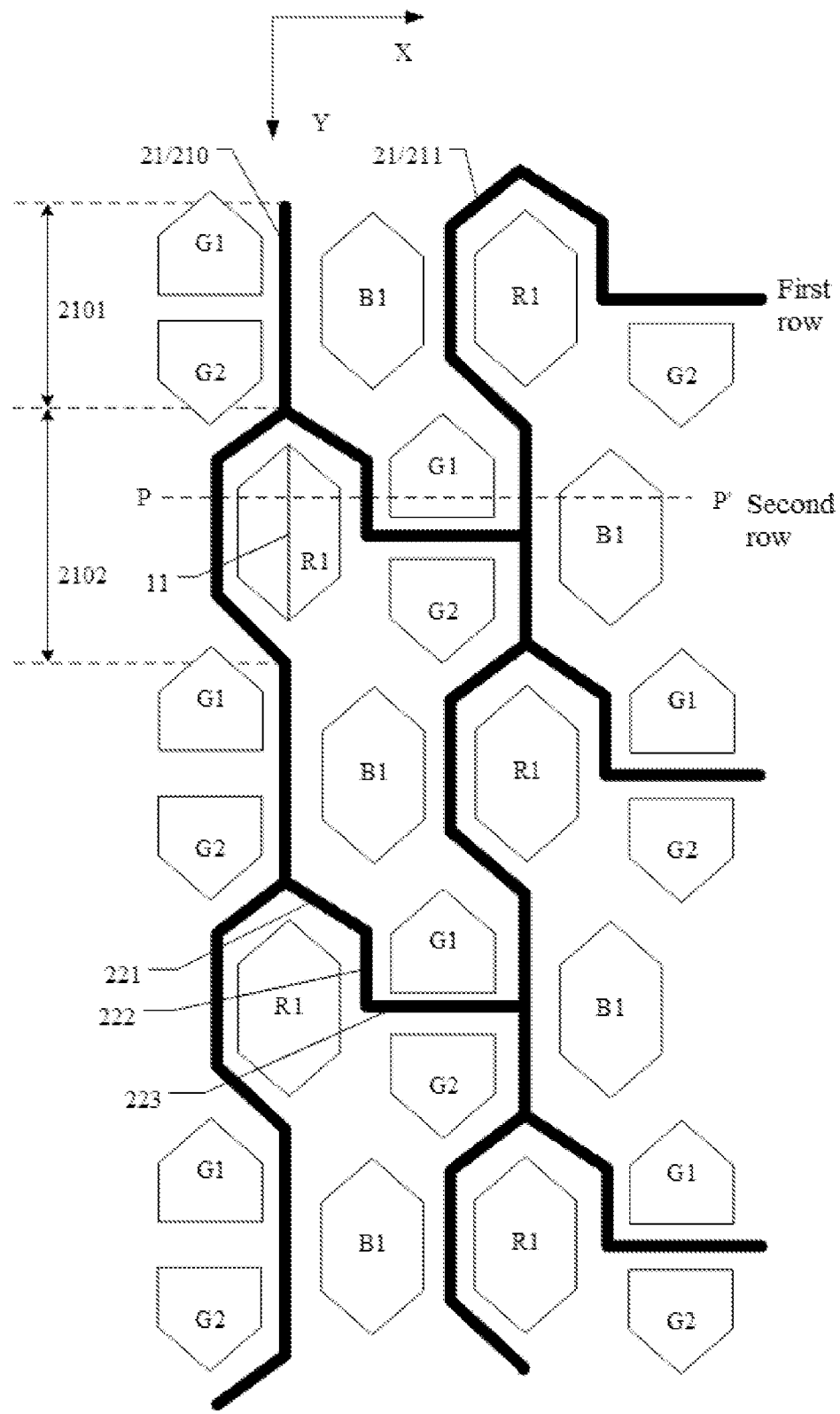
FIG. 6 is another partial diagram of a display substrate according to an embodiment of the present disclosure.
Figure 7:
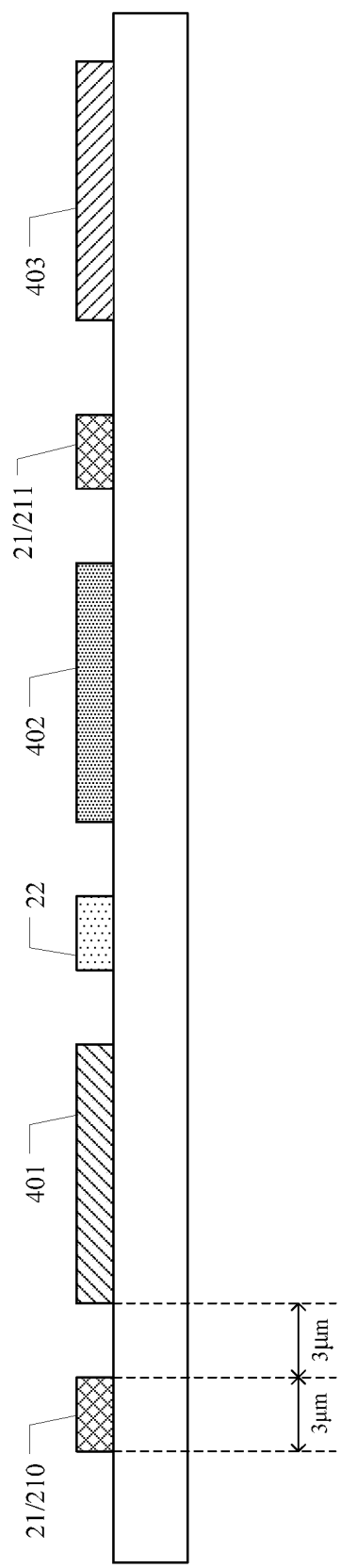
FIG. 7 is a cross-sectional view of the display substrate taken along line P-P' of FIG. 6.

FIG. 6 is another partial diagram of a display substrate according to an embodiment of the present disclosure. FIG. 7 is a cross-sectional view of the display substrate taken along line P-P' of FIG. 6.

For example, as shown in FIGS. 1 and 6, in the second direction Y, the primary signal line 21 includes a first portion 2101 and a second portion 2102. The first portion 2101 is located between the second sub-pixel B1 and the two third sub-pixels G1 and G2 in the repeating unit 100, and the second portion 2102 is located between the adjacent repeating units 100. That is, the portion of the first primary signal line 210 located in the first row is the first portion 2101, and the portion of the first primary signal line 210 located in the second row is the second portion 2102. The first portion 2101 may be a straight line, and an extension line of the first portion 2101 in the second direction Y passes through the center of the first sub-pixel R1. The second portion 2102 may be routed along the outline of the side of the first sub-pixel R1 distal from the two third sub-pixels G1 and G2 and is similar in shape to the side of the first sub-pixel R1 distal from the two third sub-pixels G1 and G2. Optionally, the primary signal line 21 may extend in the second direction Y with the first portion 2101 and the second portion 2102 as one repeating unit.

Optionally, as shown in FIG. 6, the first sub-pixel R1 may be symmetrical about an axis of symmetry 11, and the axis of symmetry 11 is parallel to the second direction Y, then the extension line of the first portion 2101 in the second direction Y may coincide with the axis of symmetry 11. For example, if the shape of the first sub-pixel R1 is a hexagon and the axis of symmetry 11 passes through two vertices of the hexagon, the shape of the second portion 2102 may be composed by two sides and an upper bottom side of an isosceles trapezoid. If the shape of the first sub-pixel R1 is a long ellipse and the axis of symmetry 11 passes through two focal points of the long ellipse, the shape of the second portion 2102 may be semi-elliptical.

For example, the portion of the second primary signal line 211 located in the first row is the same as the portion of the first primary signal line 210 located in the second row, and the portion of the second primary signal line 211 located in the second row is the same as the portion of the first primary signal line 210 located in the first row.

For example, the first row may be an odd-numbered row, and accordingly, the second row is an even-numbered row, which is not limited herein. The first line may also be an even-numbered row, and the second row is an odd-numbered row.

For example, the auxiliary signal line 22 may be branched from the primary signal line 21. As shown in FIG. 1, the auxiliary signal line 22 may be branched from one of two adjacent primary signal lines 21 (e.g., the first primary signal line 210 shown in FIG. 1). Then, the auxiliary signal line 22 extends in a direction different from the extending direction of the primary signal line 21 and passes through an interval between the two third sub-pixels G1 and G2. Finally, the auxiliary signal line 22 extends to the other of the two adjacent primary signal lines 21 (e.g., the second primary signal line 211 shown in FIG. 1)

Optionally, as shown in FIG. 6, in the second row, the auxiliary signal line 22 may be branched from an intersection of the first portion 2101 and the second portion 2102 of the first primary signal line 210, and may be routed along the outline of the side of the first sub-pixel R1 proximal to the two third sub-pixels G1 and G2. That is, the routing direction of the auxiliary signal line 22 is different from the routing direction of the second portion 2102 of the first primary signal line 210. Then, when the auxiliary signal line 22 extends to the interval between the two third sub-pixels G1 and G2, the auxiliary signal line 22 extends to the interval between the two third sub-pixels G1 and G2. Finally, the auxiliary signal line 22 extends to the second primary signal line 211 adjacent to the first primary signal line 210.

Optionally, the plurality of repeating units 100 in the display substrate form a plurality of repeating unit rows. Each of the repeating unit rows includes a plurality of repeating units that are arranged in a third direction. The plurality of repeating units are arranged in a fourth direction. The third direction is different from the fourth direction. The third direction may be the direction (that is, the first direction X) of the first diagonal 301 of the parallelogram 30, and the fourth direction may be the direction (that is, the second direction Y) of the second diagonal 302 of the parallelogram 30. As shown in FIG. 6, each of the auxiliary signal lines 22 may include a first line segment 221, a second line segment 222, and a third line segment 223. The third line segment 223 of each of the auxiliary signal lines 22 extends in the first direction. The second line segment 222 of each of the auxiliary signal lines 22 may extend in the second direction Y. The extending direction of the first line segment 221 is different from the first direction X and the second direction Y. Optionally, the first line segments 221 of the plurality of auxiliary signal lines 22 have the same extending direction, i.e., the first line segments 221 of the plurality of auxiliary signal lines 22 are parallel to each other. The second line segment 222 of the plurality of auxiliary signal lines 22 have the same extending direction, i.e., the second line segments 222 of the plurality of auxiliary signal lines 22 are parallel to each other. The third line segments 223 of the plurality of auxiliary signal lines 22 extend in the same direction, i.e., the third line segments 223 of the plurality of auxiliary signal lines 22 are also parallel to each other.

Optionally, when a plurality of repeating units are repeatedly arranged in the direction of the first diagonal (i.e., the first direction X) to form a repeating unit row and the plurality of repeating unit rows are arranged in the direction of the second diagonal (i.e., the second direction Y), i.e., in the example shown in FIG. 3, the first line segment 221 is located between the first sub-pixel R1 and the second sub-pixel B1 directly adjacent to the first sub-pixel R1 in an adjacent repeating unit row, the third line segment 223 is located between the two third sub-pixels G1 and G2 in the same repeating unit, and the second line segment 222 is configured to connect the first line segment 221 and the third line segment 223 (that is, one end of the second line segment 222 is connected to the first line segment 221, and the other end of the second line segment 222 is connected to the third line segment 223). For example, the second line segment 222 is located between the first sub-pixel R1 and the third sub-pixel G1 in the same repeating unit.

Optionally, a projection of the third line segment 223 of the auxiliary signal line 22 located in an odd-numbered repeating unit row in the second direction Y does not overlap a projection of the third line segment 223 of the auxiliary signal line 22 located in an even-numbered repeating unit row in the second direction Y. The third line segments 223 of all the auxiliary signal lines 22 located in the same odd-numbered repeating unit row are on the same straight line. The third line segments 223 of all the auxiliary signal lines 22 in the same even-numbered repeating unit row are on the same straight line.

Optionally, when a plurality of repeating units are repeatedly arranged in the direction of the first diagonal (i.e., the first direction X) to form a repeating unit column and the plurality of repeating unit columns are arranged in the direction of the second diagonal (i.e., the second direction Y), i.e., in the example shown in FIG. 4, the first line segment 221 is located between the first sub-pixel R1 and the second sub-pixel B1 directly adjacent to the first sub-pixel R1 in an adjacent repeating unit column, the third line segment 223 is located between the two third sub-pixels G1 and G2 in the same repeating unit, and the second line segment 222 is configured to connect the first line segment 221 and the third line segment 223 (that is, one end of the second line segment is connected to the first line segment 221, and the other end of the second line segment 222 is connected to the third line segment 223). For example, the second line segment 222 is located between the first sub-pixel R1 and the third sub-pixel G1 in the same repeating unit.

Optionally, a projection of the third line segment 223 of the auxiliary signal line 22 located in an odd-numbered repeating unit column in the second direction Y does not overlap a projection of the third line segment 223 of the auxiliary signal line 22 located in an even-numbered repeating unit column in the second direction Y. The third line segments 223 of all the auxiliary signal lines 22 located in the same odd-numbered repeating unit column are on the same straight line. The third line segments 223 of all the auxiliary signal lines 22 in the same even-numbered repeating unit column are on the same straight line.

For example, an auxiliary signal line branched from an odd-numbered primary signal line (e.g., the first primary signal line 210 and the third primary signal line 212) is located in an even-numbered repeating unit row, and an auxiliary signal line branched from an even-numbered primary signal line (e.g., the second primary signal line 211 and the fourth primary signal line 213) is located in an odd-numbered repeating unit row. As shown in FIG. 2, the auxiliary signal lines 22 located between the first primary signal line 210 and the second primary signal line 211 (the auxiliary signal lines 22 are branched from the first primary signal line 210) are located in an even-numbered repeating unit row. The auxiliary signal lines 22 located between the third primary signal line 212 and the fourth primary signal line 213 (the auxiliary signal lines 22 are branched from the third primary signal line 212) are located in an even-numbered repeating unit row. The auxiliary signal lines 22 located between the second primary signal line 211 and the third primary signal line 212 (these auxiliary signal lines 22 are branched from the second primary signal line 211) are located in an odd-numbered repeating unit row. That is, the third line segment 223 of the auxiliary signal line 22 located between the first primary signal line 210 and the second primary signal line 211 passes between the two third sub-pixels corresponding thereto in an even-numbered repeating unit row. The third line segment 223 of the auxiliary signal line 22 located between the second primary signal line 211 and the third primary signal line 212 passes between the two third sub-pixels corresponding thereto in an odd-numbered repeating unit row.

In the embodiment of the present disclosure, the first sub-pixel R1, the second sub-pixel B1, and the third sub-pixels G1 and G2 each include an anode. Optionally, the first sub-pixel R1 includes a first luminescent element. The first luminescent element includes a first anode, a first cathode, and a first luminescent layer. The first luminescent layer is disposed between the first anode and the first cathode. The second sub-pixel B1 includes a second luminescent element. The second luminescent element includes a second anode, a second cathode, and a second luminescent layer. The second luminescent layer is disposed between the second anode and the second cathode. The two third sub-pixels G1 and G2 each include a third luminescent element. The third luminescent element includes a third anode, a third cathode, and a third luminescent layer. The third luminescent layer is disposed between the third anode and the third cathode.

Optionally, the primary signal line 21 and the auxiliary signal line 22 may be disposed in the same layer as the anode of the luminescent element. As shown in FIG. 7, the first luminescent element includes a first anode 401, the second luminescent element includes a second anode 402, and the third luminescent element includes a third anode 403. The primary signal line 21, the auxiliary signal line 22, the first anode 401, the second anode 402, and the third anode 403 are located in the same layer. Here, different components being disposed in the "same layer" means that the components are located on the surface of the same layer structure or are formed by patterning the same material layer. At least some of the plurality of primary signal lines and auxiliary signal lines are made of the same material as the anode, or the plurality of primary signal lines and the auxiliary signal lines are prepared from different materials from the anode.

Optionally, the line widths of the primary signal line 21 and the auxiliary signal line 22 may be 3 microns (µm). The minimum length between the boundary of the first primary signal line 210 adjacent to the first sub-pixel R1 and the boundary of the first anode 401 may be 3 µm. The minimum length between the boundary of the auxiliary signal line 22 and the boundary of the adjacent first anode 401 and second anode 40 2 may be 3 µm. The minimum length between the boundary of the second primary signal line 211 and the boundary between the adjacent second anode 402 and the third anode 403 may also be 3 µm.

Optionally, the primary signal line 21 and the auxiliary signal line 22 may be formed of the same conductive material as the anode of the luminescent element (e.g., the first anode 401, the second anode 402, and the third anode 403). The conductive material may be indium tin oxide (ITO), silver (Ag), or the like.

Optionally, as shown in FIG. 1, a protruding portion is included in each sub-pixel, such as a protruding portion that protrudes from the first sub-pixel R1 and the second sub-pixel B1 of the hexagon and a protruding portion that protrudes from the third sub-pixel of the pentagon. The protruding portions of the respective sub-pixels (e.g., the first sub-pixel R1, the second sub-pixel B1, and the third sub-pixel G1) are used to connect the anode of the luminescent element and an anode signal line. The material of the protruding portions of the respective sub-pixels is the same as the anode, namely indium tin oxide (ITO), silver (Ag), and the like. For example, the anode may be connected to the anode signal line through a via penetrating through the dielectric layer at the protruding portion. The embodiment of the present disclosure sets no limitation to connection of the anode and the anode signal line. The protruding portions of the respective sub-pixels are located in the same layer as the primary signal line 21 and the auxiliary signal line 22, and do not overlap. That is, during the arrangement of the above-mentioned primary signal line and auxiliary signal line, the primary signal line 21 and the auxiliary signal line 22 need to circumscribe the protruding portions of the respective sub-pixels to prevent the above-mentioned signal lines from being short-circuited with the anode.

It should be noted that, as shown in FIG. 1, the first sub-pixel R1 includes a first anode, the shape of the first anode is a hexagon which is symmetrical about the axis of symmetry 11, and the protruding portion of the first sub-pixel R1 represents a portion of the first sub-pixel R1 other than the first anode, i.e., a portion of the first sub-pixel R1 which protrudes outward from one side of the hexagon in FIG. 1. The second sub-pixel B1 includes a second anode, the shape of the second anode is also a hexagon, and the protruding portion of the second sub-pixel B1 represents a portion of the second sub-pixel B1 other than the second anode. The third sub-pixel G1 includes a third anode, the shape of the third anode may be a right-angled bottom angle symmetrical pentagon, and the protruding portion of the third sub-pixel G1 represents a portion of the third sub-pixel G1 other than the symmetrical pentagon region.

It should be noted that, in description of the overall shape of the sub-pixel, the protruding portion is not counted, and therefore, in addition to FIG. 1, the other drawings of the present disclosure do not show the protruding portions of the respective sub-pixels.

For example, if the display substrate 10 is a liquid crystal display substrate, the primary signal line 21 and the auxiliary signal line 22 may be signal lines of a common voltage, and thus, the primary signal line 21 and the auxiliary signal line 22 are configured to supply a common voltage to a plurality of repeating units 100. If the display substrate 10 is an organic light-emitting diode display substrate, the primary signal line 21 and the auxiliary signal line 22 may be signal lines of a reference voltage, and thus, the primary signal line 21 and the auxiliary signal line 22 are configured to supply a reference voltage to a plurality of repeating units 100.

Figure 8:
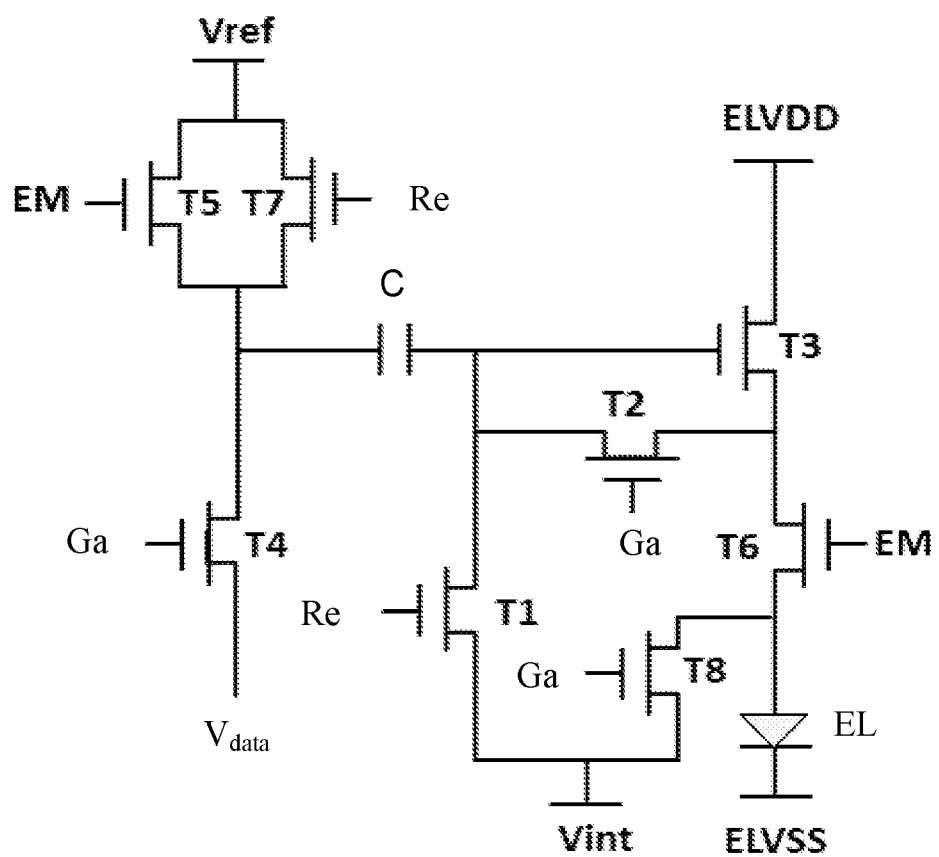
FIG. 8 is a schematic structural diagram of a pixel circuit.

FIG. 8 is a schematic structural diagram of a pixel circuit. For example, as shown in FIG. 8, for an organic light-emitting diode display substrate, the pixel circuit may be realized by an 8T1C mode. The pixel circuit includes a drive transistor T3, a data input transistor T4, a storage capacitor C, a reset transistor T1, a first threshold compensation transistor T2, a second threshold compensation transistor T8, a first voltage drop compensation transistor T5, a second voltage drop compensation transistor T7, and a light emission control transistor T6. The drive transistor T3 is configured to drive a luminescent element EL to emit light. The data input transistor T4 is configured to write a data voltage Vdata to the gate of the drive transistor T3 under the control of a scanning signal Ga. The storage capacitor C is configured to store the data signal Vdata and remains the same at the gate of the drive transistor T3. The first threshold compensation transistor T2 and the second threshold compensation transistor T8 are configured to write a threshold compensation signal to the gate of the drive transistor T3 to compensate for the threshold voltage drift of the drive transistor T3. The first voltage drop compensation transistor T5 and the second voltage drop compensation transistor T7 are configured to write a reference voltage signal Vref to the gate of the drive transistor T3. The reset transistor T1 is configured to write a reset voltage Vint to the gate of the drive transistor T3 under the control of a reset signal Re. The light emission control transistor T6 is configured to control the luminescent element EL and the drive transistor T3 to be turned on or off under the control of a light-emitting signal EM.

For example, in the 8T1C pixel circuit, based on a saturation current formula of the drive transistor T3, an illuminating current $I_{OLED}$ flowing through the drive transistor T3 may be expressed as:

$$IOLED=0.5\mu nCox(W/L)(Vdata-Vref)^2.$$

where Vdata represents a data voltage, Vref represents a reference voltage, μm is an electron mobility of the drive transistor T3, Cox is a gate unit capacitance of the drive transistor T3, W is a channel width of the drive transistor T3, and L is a channel length of the drive transistor T3. As seen from the above formula, the illuminating current $I_{OLED}$ is related to the reference voltage Vref and the data voltage Vdata. The illuminating current $I_{OLED}$ is related to the stability of the reference voltage Vref. The fluctuation of the reference voltage Vref causes the illuminating current $I_{OLED}$ to change, thereby causing the display brightness of the display panel to change. In the embodiment of the present disclosure, the primary signal line 21 and the auxiliary signal line 22 are configured to supply the reference voltage Vref to the pixel circuit. Since the primary signal line 21 and the auxiliary signal line 22 may be meshed, the resistance interconnection is good, and thus the resistance of the signal line is small, the voltage drop of the reference voltage Vref is low, the control capability for the pixel circuit is better, and thus the stability of the reference voltage Vref may be improved, thereby improving the display effect of the display panel.

The above-described drive circuit structure is merely exemplary, the display device according to an embodiment of the present disclosure is not limited thereto, and any suitable drive circuit structure may be employed.

Optionally, the plurality of primary signal lines 21 are configured to supply a reference voltage or a common voltage to a plurality of repeating units. For example, the first sub-pixel, the second sub-pixel, and the third sub-pixel each include an anode. The plurality of primary signal lines and the auxiliary signal line are in the same layer as the anode.

Figure 9:
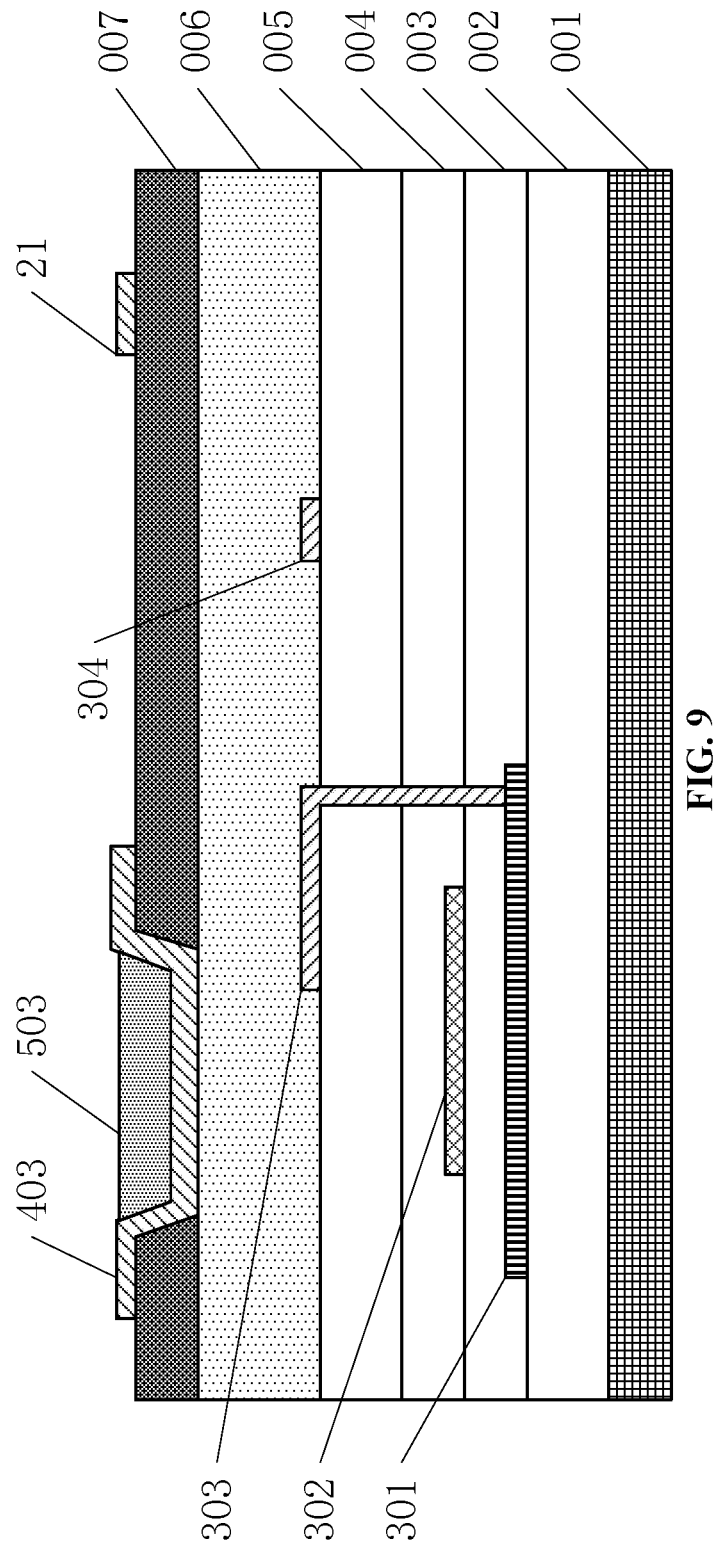
FIG. 9 is a partial cross-sectional structural view of a display substrate according to an embodiment of the present disclosure.
Figure 14:
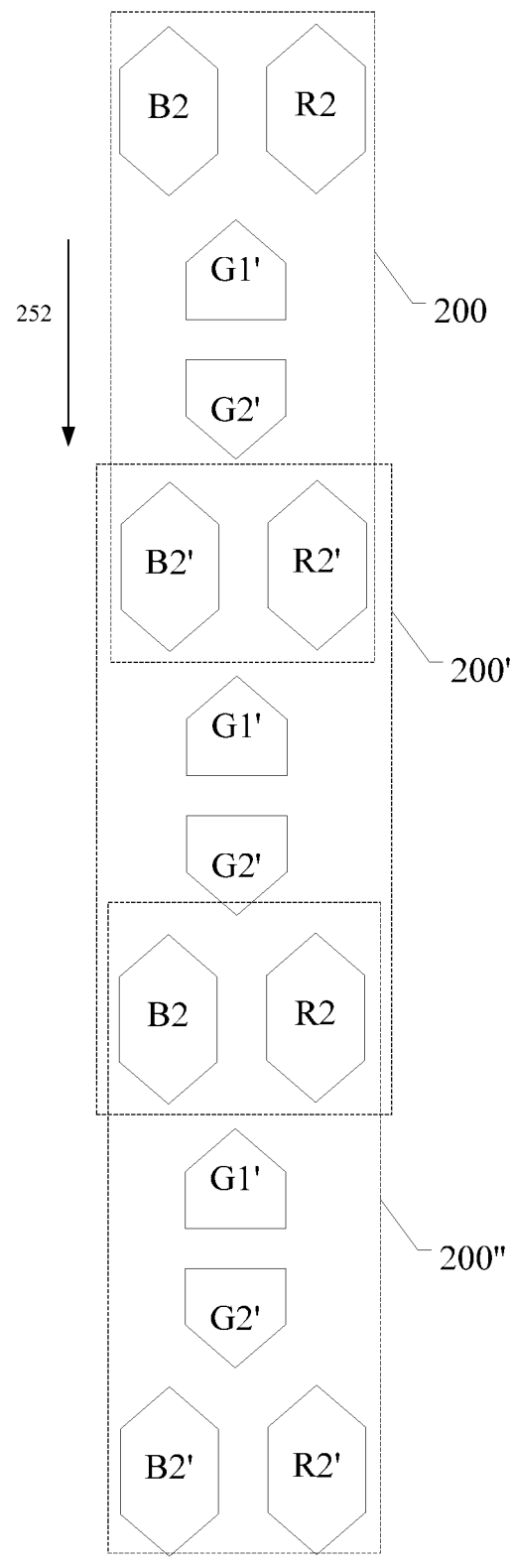
FIG. 14 is a schematic diagram of a pixel group column in the display substrate shown in FIG. 12.

FIG. 9 is a cross-sectional view taken along line MM' of FIG. 14. A cross-sectional structure located around a green sub-pixel (the third sub-pixel) is, for example, as shown in FIG. 9. The structure includes a base substrate 001 and a buffer layer 002, a first gate insulating layer 003, a second gate insulating layer 004, an interlayer dielectric layer 005, a planarization layer 006, and a pixel defining layer 007 sequentially disposed on the base substrate. As seen from FIG. 9, a thin film transistor is arranged under the third sub-pixel. The thin film transistor includes a gate 302, an active layer 301, and a drain electrode 303. The thin film transistor is one of the above-mentioned pixel drive electrodes, and a connection relationship thereof with other components may be set according to a specific pixel circuit arrangement, which is not described in detail herein. In addition, a signal line 304 may also be included at a position in the same layer as the drain electrode 303. The signal line 304 may also be used as a signal line of a specific function according to different pixel circuit arrangements. For example, the signal line may be a data line or a gate line or the like. As seen from FIG. 9, the pixel defining layer 007 may include an opening defining a sub-pixel. The anode 403 of the third sub-pixel and the luminescent layer 503 of the third sub-pixel are located in the opening of the pixel defining layer 007.

Optionally, as shown in FIG. 9, the anode 403 of the third sub-pixel and the luminescent layer 503 of the third sub-pixel are in contact with each other, such that the portion where the anode 403 and the luminescent layer 503 are in contact with each other may drive the luminescent layer to emit light. In this way, the portion where the anode 403 of the third sub-pixel and the luminescent layer 503 of the third sub-pixel are in contact with each other is an effective portion where the sub-pixel may emit light. Here, the anode 403 of the third sub-pixel serves as a pixel electrode, such that different data voltages may be applied to different sub-pixels. However, according to an embodiment of the present disclosure, the electrode serving as the pixel electrode of the sub-pixel is not limited to the anode, and the cathode of the light-emitting diode may be used as the pixel electrode. Therefore, in the embodiment of the present disclosure, the shape of the sub-pixel may refer to the shape of a portion where the pixel electrode and the luminescent layer are in contact with each other. For example, for each sub-pixel, the area of the pixel electrode may be slightly greater than the area of the luminescent layer, or the area of the luminescent layer may be slightly greater than the area of the pixel electrode, which is not particularly limited in the embodiment of the present disclosure. For example, the luminescent layer herein may include an electroluminescent layer itself and other functional layers on two sides of the electroluminescent layer, for example, a hole injection layer, a hole transport layer, an electron injection layer, an electron transport layer, and the like. In some embodiments, the shape of the pixel may also be defined by the pixel defining layer. For example, a lower electrode (e.g., an anode) of the light-emitting diode may be disposed under the pixel defining layer. The pixel defining layer includes an opening for defining a pixel which exposes a portion of the lower electrode. When the luminescent layer is formed in the opening of the pixel defining layer, the luminescent layer is in contact with the lower electrode, such that the luminescent layer may be driven to emit light in this portion. Therefore, in this case, the opening of the pixel defining layer defines the shape of the sub-pixel.

Optionally, the shapes of the various sub-pixels described in the embodiments of the present disclosure are all substantial shapes, and when the luminescent layer or various electrode layers are formed, it fails to be ensured that the edges of the sub-pixels are strictly straight lines or the corners are strictly angular. For example, on the basis of the various graphic shapes described above, the corners of the respective sub-pixels are rounded. That is, although the shape of each sub-pixel in the drawing includes an angle strictly formed by two line segments, in some embodiments, the shape of each sub-pixel may be a rounded pattern. For example, in the case where the luminescent layer is vapor-deposited through a mask, the portion of the luminescent layer located at the corner may naturally form a rounded shape. In some cases, as mentioned above, the metal etch has a draft angle. Therefore, when the luminescent layer of the sub-pixel is formed by an evaporation process, a corner of the luminescent layer may be removed.

As described above, the signal lines formed by the primary signal line 21 and the auxiliary signal line 22 may be used as reference voltage lines, and as shown in FIG. 8, may be connected to the pixel drive circuit of each sub-pixel. For example, around each sub-pixel, the signal line may be connected to the underlying pixel circuit through a via penetrating through an underlying insulating layer. For example, as shown in FIG. 9, the signal line may be connected to the pixel circuit through the vias in the insulating layers (e.g., the first gate insulating layer 003, the second gate insulating layer 004, the interlayer dielectric layer 005, the planarization layer 006, and the pixel defining layer 007) below the primary signal line 21. The specific location of the via may be selected according to design requirements. The via structure is not shown in the cross section shown in FIG. 9. Further, the mesh structure formed by the above signal lines may be connected to a reference voltage source as a whole in a peripheral region of the display substrate. For example, a ring-shaped reference voltage signal line is included at the periphery of the display substrate, and the grid-like signal line is connected to the ring-shaped signal line, thereby inputting a reference voltage into the pixel electrode structure of each sub-pixel.

Optionally, the pixel circuit includes at least one transistor (the first voltage drop compensation transistor T5 and/or the second voltage drop compensation transistor T7 in FIG. 6A), each of which includes a gate, an active layer, and a source drain. In one example, the signal line is electrically connected to the source or drain of the corresponding transistor through a via penetrating through the insulating layer underneath. In one example, the active layer of the transistor is formed of a polysilicon layer, and on two sides of the channel region of the active layer, the polysilicon layer is conductorized to form a source drain. For example, the signal line is electrically connected to a polysilicon source or drain formed by conductorization through a via. For example, the transistor is a top gate transistor. The via for electrically connecting the signal line to the source or drain of a corresponding transistor passes through a gate metal layer and a data metal layer. A portion of the metal pattern of the gate metal layer and the data metal layer may serve as a relay connection for electrical connection with via, which is not limited in the embodiments of the present disclosure.

Optionally, as shown in FIG. 5, the length of the first sub-pixel R1 in the direction of the second diagonal 302 is greater than the length of the first sub-pixel R1 in the direction of the first diagonal 301, the length of the second sub-pixel B1 in the direction of the second diagonal 302 is greater than the length of the second sub-pixel B1 in the direction of the first diagonal 301. That is, if the shape of the first sub-pixel R1 is a rectangle, the side length of the first sub-pixel R1 in the direction of the first diagonal 301 is smaller than the side length thereof along the second diagonal 302. If the shape of the first sub-pixel R1 is a long ellipse, a line connecting two focal points of the long ellipse is substantially parallel to the second diagonal 302.

Optionally, the shapes and areas of the first sub-pixel R1 and the second sub-pixel B1 may be the same.

Optionally, as shown in FIG. 5, the first sub-pixel R1 may be symmetrical about a line where the first diagonal 301 is located. The second sub-pixel B1 may also be symmetrical about a line where the first diagonal 301 is located.

Optionally, shapes of the first sub-pixel R1 and the second sub-pixel B1 may include a rectangle, a hexagon, or a long ellipse or the like. The hexagon may be an equilateral hexagon or the like.

Optionally, the shapes and areas of the two third sub-pixels G1 and G2 are the same.

Optionally, the areas of the first sub-pixel R1 and the second sub-pixel B1 are both greater than that of each of the two third sub-pixels G1 and G2.

Optionally, the shape of each of the two third sub-pixels G1 and G2 includes a rectangle (e.g., a square), a pentagon, a diamond, or the like. The pentagon includes a right-angled bottom pentagon, a right-angled trapezoid, or the like.

Optionally, as shown in FIG. 3, the shapes of the two third sub-pixels G1 and G2 may be symmetrical about the first diagonal 301.

It should be noted that the area of each sub-pixel may be specifically set according to the luminous efficiency of the luminescent material. For example, if the luminous efficiency of the luminescent material is high, the area of the sub-pixel may be small; or if the luminous efficiency of the luminescent material is low, the area of the sub-pixel may be large.

Optionally, the two third sub-pixels G1 and G2 may be formed by an opening, thereby effectively reducing the process difficulty of a fine metal mask (FMM). The two third sub-pixels G1 and G2 being formed by an opening indicates that an opening region of one FMM may be shared when the luminescent layers of the two adjacent third sub-pixels G1 and G2 are vapor-deposited. In the opening region, only the portion where the luminescent material is evaporated onto the pixel electrode form the third sub-pixels G1 and G2 to emit light, and the luminescent material which is evaporated onto the insulating paste cannot emit light.

In some examples, the third sub-pixels G1 and G2 are sensitive color sub-pixels. Since the sensitivity of the human eye to color is different, if adjacent sensitive color sub-pixels are too proximal to each other, the two adjacent sensitive color sub-pixels are difficult to distinguish and thus will be visually combined into one pixel by the human eye. Therefore, the pixel arrangement structure may improve the distribution uniformity of the sensitive color sub-pixels, thereby improving the visual resolution. It should be noted that when the pixel arrangement structure adopts the red, green and blue (RGB) mode, the above sensitive color is green.

In some examples, the third sub-pixels G1 and G2 are green sub-pixels. The first sub-pixel R1 is a red sub-pixel, and the second sub-pixel B1 is a blue sub-pixel, which is not limited. Alternatively, the first sub-pixel R1 may be a blue sub-pixel, and the second sub-pixel B1 is a red sub-pixel.

As shown in FIG. 1, in each of the repeating units 100, the minimum distance h1 between the boundaries of the two third sub-pixels G1 and G2 in the direction of the second diagonal (i.e., the second direction Y) is in the range of 8-14 micrometers (μm) to avoid that the two adjacent third sub-pixels G1 and G2 are difficult to distinguish due to proximity and are visually combined into one pixel by the human eye, such that graininess may be avoided. Therefore, the pixel arrangement structure may improve the distribution uniformity of the third sub-pixel, thereby improving the visual resolution. For example, in some examples, the minimum distance h1 may be 10 microns.

Figure 10:
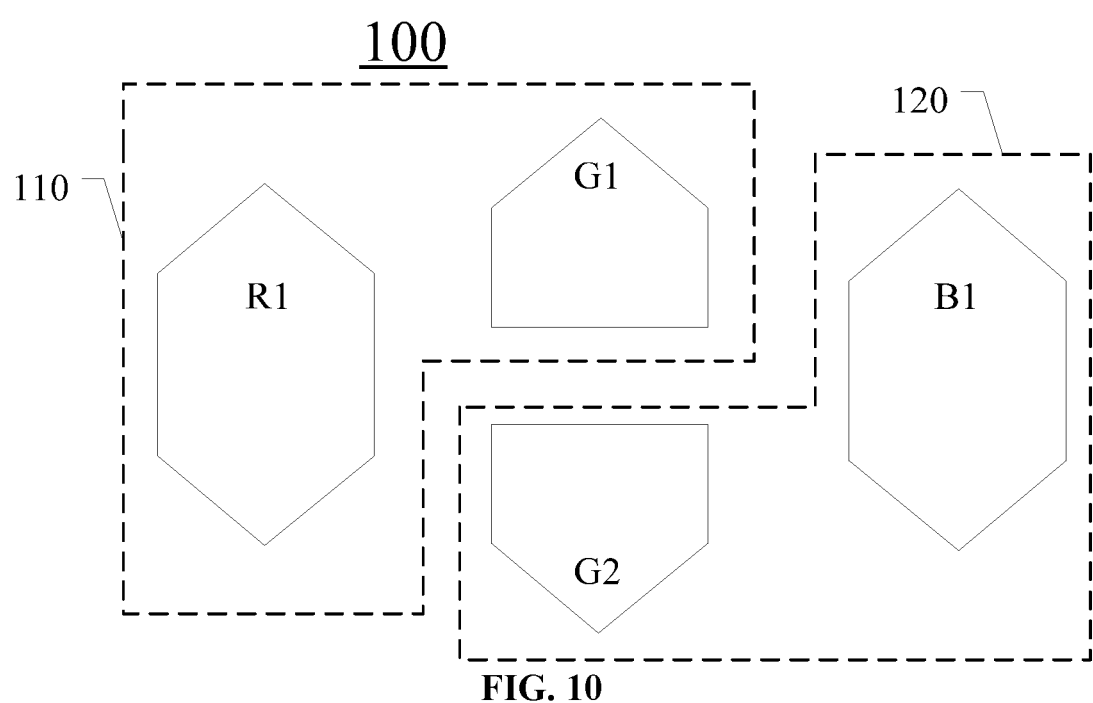
FIG. 10 is a schematic grouping diagram of virtual pixels in a repeating unit of the display substrate shown in FIG. 1.
Figure 11:
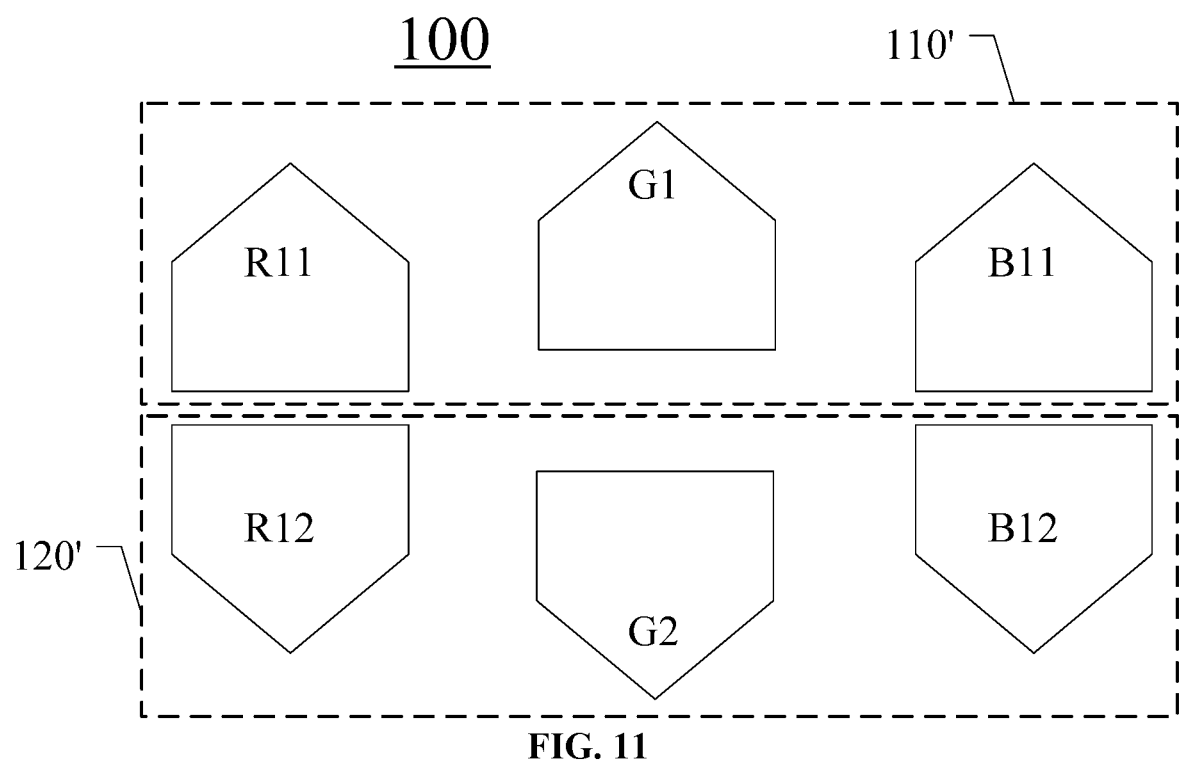
FIG. 11 is another schematic grouping diagram of virtual pixels in a repeating unit of the display substrate shown in FIG. 1.

FIG. 10 is a grouping diagram of virtual pixels in a repeating unit of the display substrate shown in FIG. 1. FIG. 11 is another grouping diagram of virtual pixels in a repeating unit of the display substrate shown in FIG. 1.

When the display substrate is used for a display panel, it may be driven by a sub-pixel rendering (SPR) algorithm to implement virtual display. For example, in some examples, in each of the repeating units 100, the first sub-pixel R1 and one of the two third sub-pixels G1 and G2 form a first virtual pixel, and the second sub-pixel B1 and the other of the two third sub-pixels G1 and G2 form a second virtual pixel. As shown in FIG. 10, the first sub-pixel R1 and the third sub-pixel G1 form a first virtual pixel 110, and the second sub-pixel B1 and the third sub-pixel G2 form a second virtual pixel 120. The first sub-pixel R1 and the second sub-pixel B1 are both shared by the first virtual pixel and the second virtual pixel.

Optionally, as shown in FIG. 5, in each of the repeating units 100, the first sub-pixel R1 and/or the second sub-pixel B1 may be divided into two sub-pixel blocks by a straight line where the first diagonal 301 is located. As shown in FIG. 11, the first sub-pixel R1 may be divided into a first sub-pixel block R11 and a second sub-pixel block R12, and the second sub-pixel B1 may be divided into a third sub-pixel block B11 and a fourth sub-pixel block B12, whereby the repeating unit 100 may implement real pixel display. As shown in FIG. 11, the first sub-pixel block R11, the third sub-pixel G1, and the third sub-pixel block B11 form a first real pixel 110', and the second sub-pixel block R12, the third sub-pixel G2, and the fourth sub-pixel block B12 form a second real pixel 120' such that a repeating unit 100 includes two real pixels.

Optionally, the first sub-pixel block R11 and the second sub-pixel block R12 are symmetrical about a vertical line of a line connecting the centers of the two third sub-pixels G1 and G2 (i.e., the second diagonal 302 in FIG. 5), and the third sub-pixel block B11 and the fourth sub-pixel block B12 are also symmetrical about the vertical line of the line connecting the centers of the two third sub-pixels G1 and G2.

Optionally, the first sub-pixel block R11 and the second sub-pixel block R12 may be formed by an opening, and the third sub-pixel block B11 and the fourth sub-pixel block B12 may also be formed by an opening, thereby effectively reducing the process difficulty of the FMM.

Figure 12:
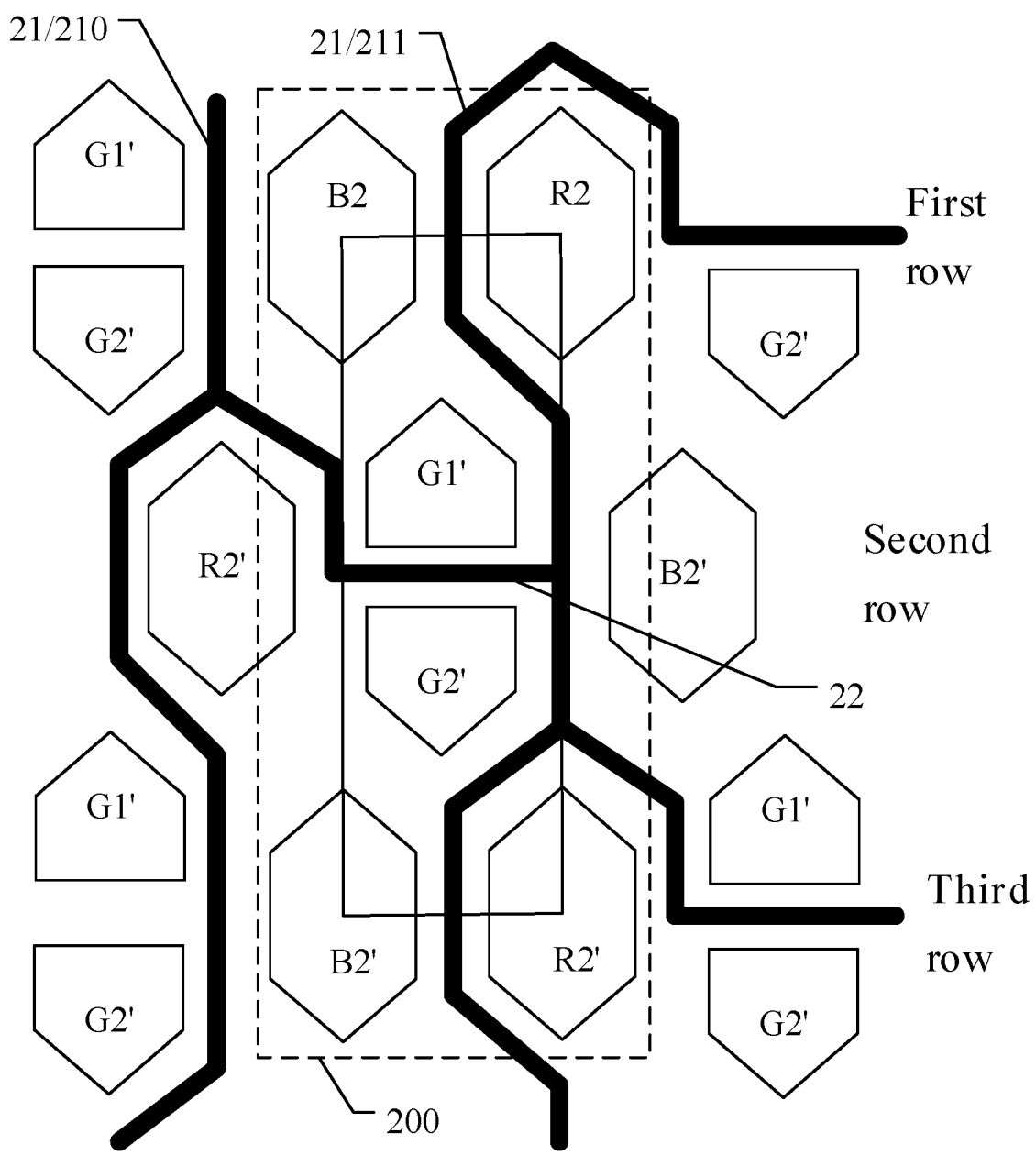
FIG. 12 is a schematic diagram of a display substrate according to another embodiment of the present disclosure.
Figure 13:
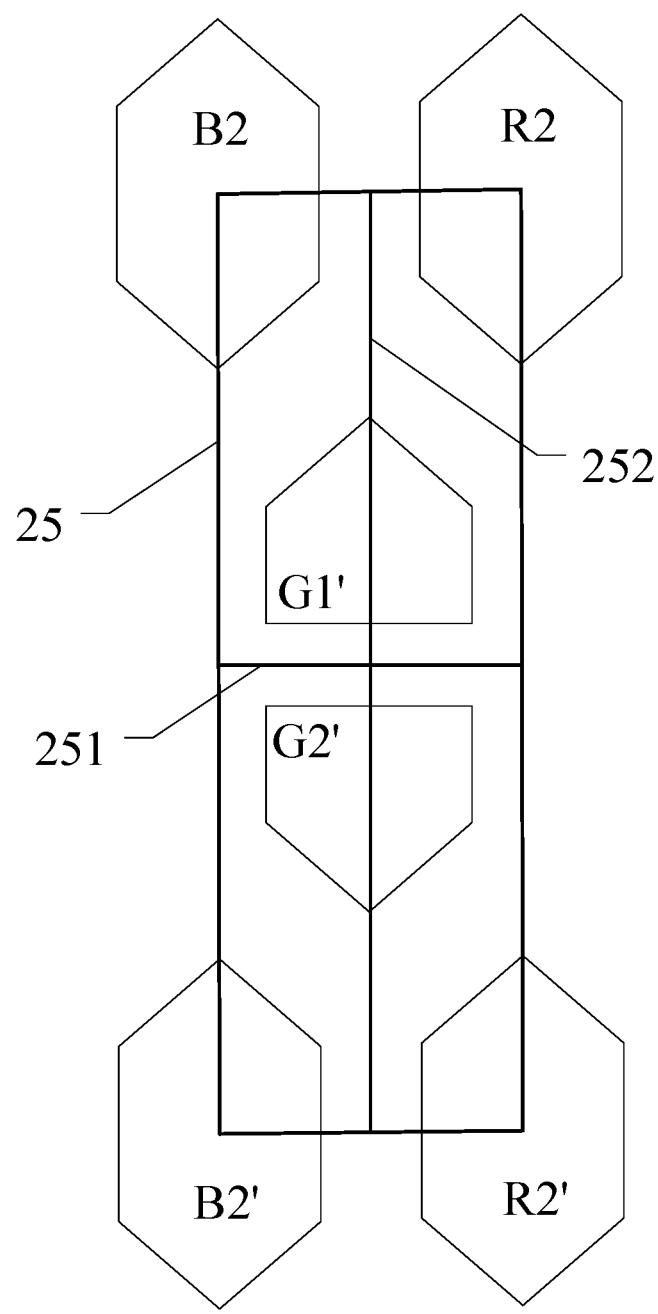
FIG. 13 is a schematic diagram of a pixel group in the display substrate shown in FIG. 12.

FIG. 12 is a schematic diagram of a display substrate according to another embodiment of the present disclosure. FIG. 13 is a schematic diagram of a pixel group in the display substrate shown in FIG. 12. FIG. 14 is a schematic diagram of a pixel group column in the display substrate shown in FIG. 12.

As shown in FIG. 12, the display substrate 10 includes a plurality of pixel groups 200, a plurality of primary signal lines 21, and an auxiliary signal line 22. Each of the pixel groups 200 includes two first sub-pixels R2 and R2', two second sub-pixels B2 and B2', and two third sub-pixels G1' and G2'.

For example, the shapes of the two first sub-pixels R2 and R2' and the two second sub-pixels B2 and B2' are both a rectangle, a hexagon, a long ellipse, and the like. The shapes of the two third sub-pixels G1' and G2' are both a pentagon, a rectangle, and the like.

As shown in FIG. 13, in each of the pixel groups 200, lines connecting the centers of the two first sub-pixels R2 and R2' and the centers of the two second sub-pixels B2 and B2' form a rectangle 25. The rectangle 25 includes a first axis of symmetry 251 and a second axis of symmetry 252 perpendicular to the first axis of symmetry 251. The two third sub-pixels G1' and G2' are arranged in the direction of the second axis of symmetry 252 and are respectively located on two sides of the first axis of symmetry 251.

It should be noted that the rectangle 25 described above is for better describing the positions of the first sub-pixel, the second sub-pixel, and the third sub-pixel, and is not an actual structure.

Optionally, as shown in FIG. 13, the first sub-pixel R2 and the first sub-pixel R2' are symmetrically disposed with respect to a line where the first axis of symmetry 251 is located, and the second sub-pixel B2 and the second sub-pixel B2' are also symmetrically disposed with respect to the line where the first axis of symmetry 251 is located. That is, the first sub-pixel R2 and the first sub-pixel R2' are located on a first side (the right side in FIG. 13) of a line where the second axis of symmetry 252 is located, and the second sub-pixel B2 and the second sub-pixel B2' are located on a second side (the left side in FIG. 13) of the line where the second axis of symmetry 252 is located.

Optionally, the shapes of the first sub-pixel R2 and the first sub-pixel R2' are symmetrical with respect to the line where the first axis of symmetry 251 is located, and the shapes of the second sub-pixel B2 and the second sub-pixel B2' are also symmetrical with respect to the line where the first axis of symmetry 251 is located.

Optionally, the shapes of the first sub-pixel R2, the first sub-pixel R2', the second sub-pixel B2, and the second sub-pixel B2' may all be the same (e.g., a hexagon or the like).

Optionally, as shown in FIG. 13, the two third sub-pixels G1' and G2' are symmetrically disposed with respect to the first axis of symmetry 251. For example, the centers of the two third sub-pixels G1' and G2' are located on the second axis of symmetry 252. That is, the center of the interval between the two third sub-pixels G1' and G2' coincides with the center of the rectangle 25.

Optionally, the shapes of the two third sub-pixels G1' and G2' may both be right-angled bottom angle symmetrical pentagons. The bottom side of the right-angled bottom angle symmetrical pentagon is parallel to the first axis of symmetry 251, and is more proximal to the first axis of symmetry 251 in the direction of the second axis of symmetry 252 with respect to the right-angled bottom angle symmetrical pentagon. The vertical distance of the center of the third sub-pixel G1' from the first axis of symmetry 251 is smaller than the vertical distance of the center of the third sub-pixel G1' from the line connecting the centers of the first sub-pixel R2 and the second sub-pixel B2.

Optionally, the shape of the third sub-pixel G1' is symmetrical about the second axis of symmetry 252, and the shape of the third sub-pixel G2' is also symmetrical about the second axis of symmetry 252.

Optionally, a plurality of pixel groups 200 form a pixel group column in the direction of the second axis of symmetry 252, i.e., the column direction of the pixel group is parallel to the second axis of symmetry 252. In the direction of the second axis of symmetry 252, two adjacent pixel groups share a first sub-pixel and a second sub-pixel. As shown in FIG. 14, in the direction of the second axis of symmetry 252, a pixel group 200, a pixel group 200', and a pixel group 200" are located in the same column, the pixel group 200 is adjacent to the pixel group 200', the pixel group 200' is adjacent to the pixel group 200", and the pixel group 200 shares the first sub-pixel R2' and the second sub-pixel B2' with the pixel group 200', i.e., the first sub-pixel R2 and the second sub-pixel B2' located at the overlapping portion of the pixel group 200 and the pixel group 200". The pixel group 200' and the pixel group 200" share the first sub-pixel R2 and the second sub-pixel B2, i.e., the first sub-pixel R2 and the second sub-pixel B2 located at the overlapping portion of the pixel group 200 and the pixel group 200'.

Optionally, as shown in FIG. 12, two third sub-pixels G1' and G2' in the pixel group 200 are located between two adjacent primary signal lines 21, and at least one auxiliary signal line 22 is disposed between the two adjacent primary signal lines 21. The auxiliary signal line 22 is connected to the two adjacent primary signal lines 21 and passes through an interval between the two third sub-pixels G1' and G2'.

Optionally, the plurality of primary signal lines 21 and the auxiliary signal line 22 are configured to supply a reference voltage or a common voltage to the plurality of pixel groups 200.

Optionally, as shown in FIGS. 12 and 13, a plurality of pixel groups 200 form a pixel group row in the direction of the first axis of symmetry 251, i.e., the row direction of the pixel group is parallel to the first axis of symmetry 251. As shown in FIG. 12, one pixel group row 200 may include a first sub-row, a second sub-row, and a third sub-row. In the pixel group 200, the first sub-pixel R2 and the second sub-pixel B2 are located in the first sub-row, the two third sub-pixels G1' and G2' are located in the second sub-row, and the first sub-pixel R2' and the second sub-pixel B2' are located in the third sub-row. In each of the pixel groups 200, the second primary signal line 211 may be sequentially routed along an interval between the first sub-pixel R2 and the second sub-pixel B2 of the first sub-row, an interval between the first sub-pixel R2 located in the first sub-row and the third sub-pixels G1' located in the second sub-row, the first side of the two third sub-pixels G1' and G2' located in the second sub-row in the direction of the first axis of symmetry 251 (the right side of FIG. 12 and FIG. 13), an interval between the third sub-pixel G2' located in the second sub-row and the first sub-pixel R2' located in the third sub-row, and an interval between the first sub-pixel R2' and the second sub-pixel B2' located in the third sub-row. Alternatively, the second primary signal line 211 may also be sequentially routed along the interval between the first sub-pixel R2 and the second sub-pixel B2 of the first sub-row, an interval between the second sub-pixel B2 located in the first sub-row and the third sub-pixels G1' located in the second sub-row, the second side of the two third sub-pixels G1' and G2' located in the second sub-row in the direction of the first axis of symmetry 251 (the second side of FIG. 12 and FIG. 13), the interval between the third sub-pixel G2' located in the second sub-row and the first sub-pixel R2' located in the third sub-row, and the interval between the first sub-pixel R2' and the second sub-pixel B2' located in the third sub-row.

Figure 15:
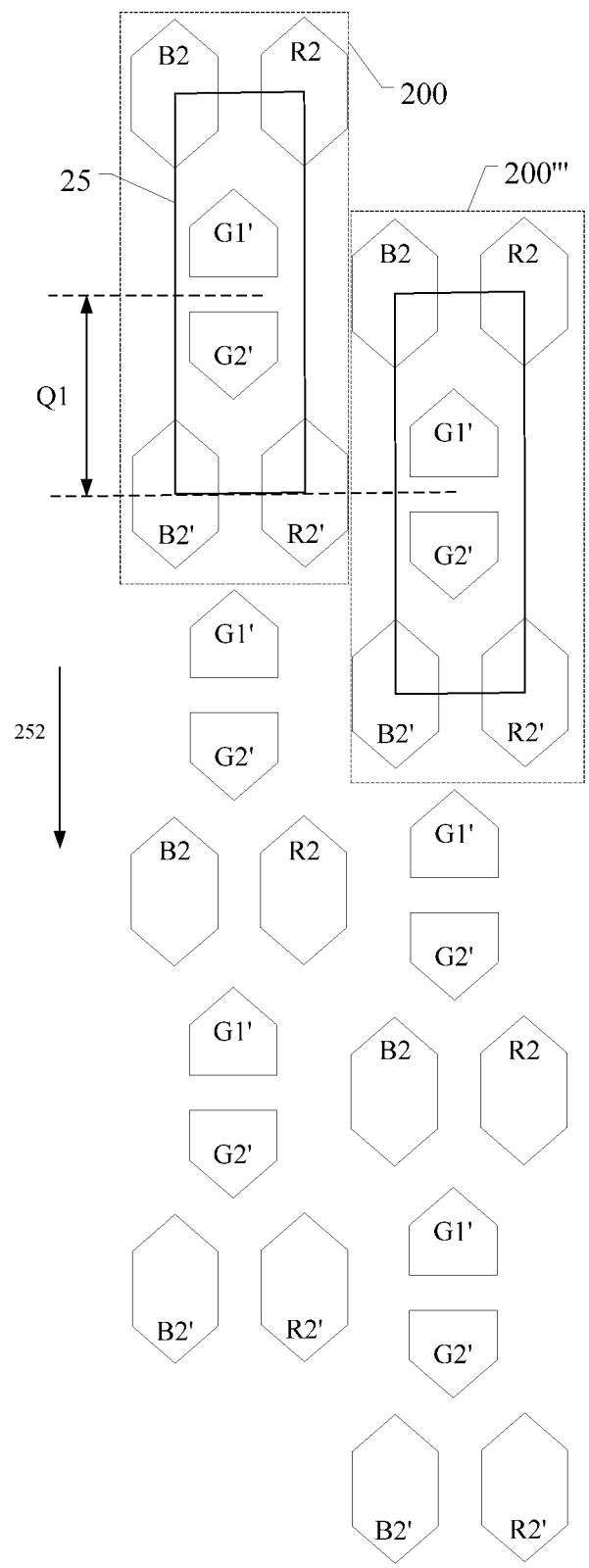
FIG. 15 is a schematic diagram of two pixel group columns in the display substrate shown in FIG. 12.

FIG. 15 is a schematic diagram of two pixel group columns in the display substrate shown in FIG. 12.

Optionally, the distance between the centers of two adjacent pixel groups of adjacent pixel group columns in the direction of the second axis of symmetry 252 is half the length of the rectangle 25 in the direction of the second axis of symmetry 252. As shown in FIG. 15, a pixel group 200 and a pixel group 200''' are located in adjacent pixel group columns, and the distance Q1 between the center of the pixel group 200 and the center of the pixel group 200''' is half the length of the rectangle 25 in the direction of the second axis of symmetry 252. That is, the center of the pixel group 200 is located on an extension line of a line connecting the centers of the first sub-pixel R2 and the second sub-pixel B2 of the pixel group 200''', and the center of the pixel group 200'''' is located on an extension line of a line connecting the centers of the first sub-pixel R2' and the second sub-pixel B2' of the pixel group 200.

Figure 16:
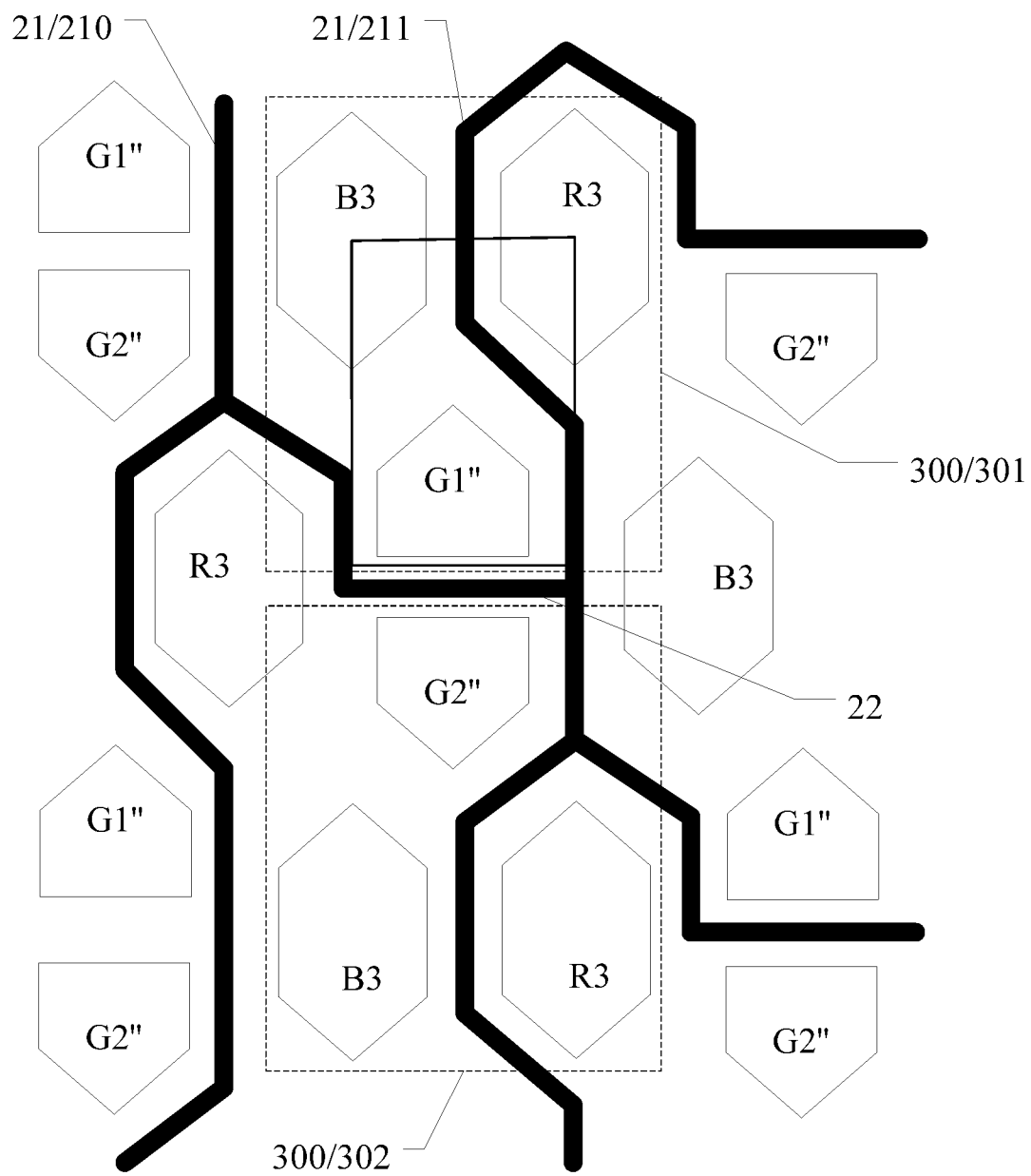
FIG. 16 is a schematic diagram of a display substrate according to still another embodiment of the present disclosure.
Figure 17:
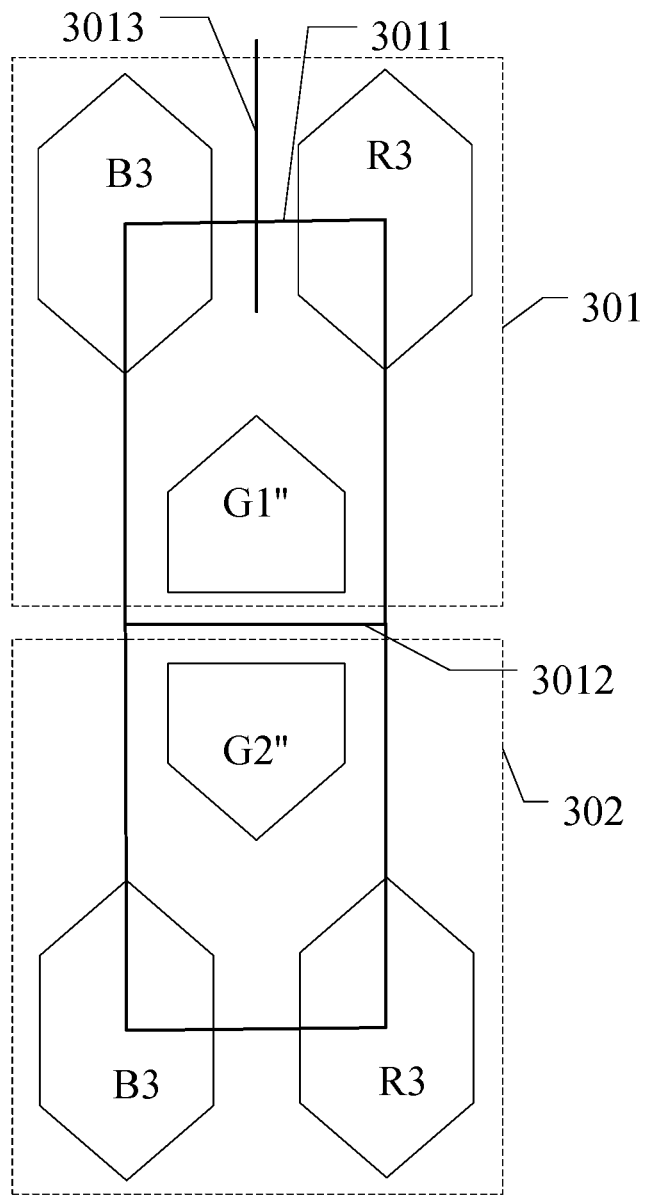
FIG. 17 is a schematic diagram of a pixel group in the display substrate shown in FIG. 16.
Figure 18:
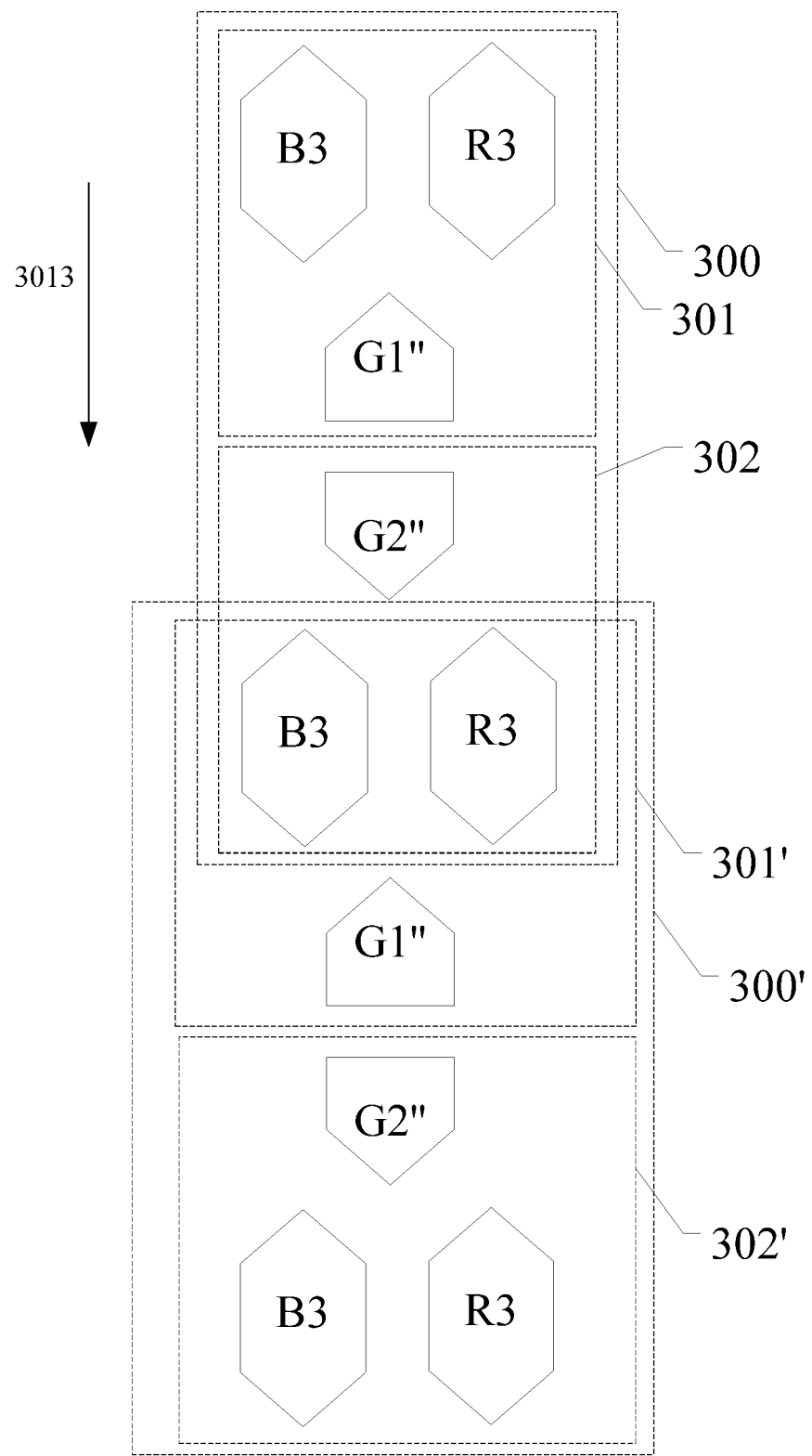
FIG. 18 is a schematic diagram of a pixel group column in the display substrate shown in FIG. 16.

FIG. 16 is a schematic diagram of a display substrate according to another embodiment of the present disclosure. FIG. 17 is a schematic diagram of a pixel group in the display substrate shown in FIG. 16. FIG. 18 is a schematic diagram of a pixel group column in the display substrate shown in FIG. 16.

Optionally, as shown in FIG. 16, the display substrate 10 includes a plurality of pixel groups 300, a plurality of primary signal lines 21, and an auxiliary signal line 22. Each of the pixel groups 300 includes a first sub-unit 301 and a second sub-unit 302. The first sub-unit 301 includes a first sub-pixel R3, a second sub-pixel B3, and a third sub-pixel G1''. The second sub-unit 302 includes a first sub-pixel R3, a second sub-pixel B3, and a third sub-pixel G2''.

Optionally, as shown in FIG. 17, the first sub-unit 301 includes a virtual rectangle. The virtual rectangle includes a first side 3011 and a second side 3012 that are parallel to each other. A line connecting the center of the first sub-pixel R3 and the center of the second sub-pixel B3 is the first side 3011 of the virtual rectangle of the first sub-unit 301. The first sub-pixel R3 and the second sub-pixel B3 are symmetrically distributed with respect to a vertical line 3013 of the first side 3012. The first sub-unit 301 and the second sub-unit 302 are mirror symmetrical about the second side 3012.

It should be noted that the above-mentioned virtual rectangle is for better description of the positions of the first sub-pixel, the second sub-pixel, and the third sub-pixel, and is not an actual structure.

Optionally, the centers of the third sub-pixel G1'' and the third sub-pixel G2'' are located on the vertical line of the first side 3011.

Optionally, the vertical distance of the center of the third sub-pixel G1'' from the first side 3011 is greater than the vertical distance of the center of the third sub-pixel G1'' from the second side 3012.

Optionally, a plurality of pixel groups 300 form a pixel column group in the direction of the vertical line 3013 of the first side 3011, i.e., the column direction of the pixel group is parallel to the vertical line 3013 of the first side 3011. In the direction of the vertical line 3013 of the first side 3011, two adjacent pixel groups share the first sub-pixel R3 and the second sub-pixel B3. For example, as shown in FIG. 18, in the direction of the vertical line 3013 of the first side 3011, a pixel group 300 and a pixel group 300' are located in the same column, and the pixel group 300 and the pixel group 300' are adjacent to each other. The pixel group 300 includes a first sub-unit 301 and a second sub-unit 302, and the pixel group 300' includes a first sub-unit 301' and a second sub-unit 302'. The pixel group 300 shares the first sub-pixel R3 and the second sub-pixel B3 with the pixel group 300', i.e., the first sub-pixel R3 and the second sub-pixel B3 located at the overlapping portion of the pixel group 300 and the pixel group 300'. That is, the first sub-pixel R3 and the second sub-pixel B3 that are shared are respectively a sub-pixel in the second sub-unit 302 in the pixel group 300 and a sub-pixel in the first sub-unit 301' in the pixel group 300'.

Optionally, as shown in FIG. 16, the third sub-pixel G1'' of the first sub-unit 301 and the third sub-pixel G2'' of the second sub-unit 302 are located between two adjacent primary signal lines 21. At least one auxiliary signal line 22 is disposed between the two adjacent primary signal lines 21. The auxiliary signal line 22 is connected to the two adjacent primary signal lines 21 and passes through an interval between the third sub-pixel G1'' of the first sub-unit 301 and the third sub-pixel G2'' of the second sub-unit 302.

Optionally, the plurality of primary signal lines 21 and the auxiliary signal line 22 are configured to supply a reference voltage or a common voltage to the plurality of pixel groups 200.

Optionally, as shown in FIG. 16 and FIG. 17, in the first sub-unit 301 of each of the pixel groups 300, the second primary signal line 211 may be sequentially routed along an interval between the first sub-pixel R3 and the second sub-pixel B3, an interval between the first sub-pixel R3 and the third sub-pixel G1", and the first side of the third sub-pixel G1" in the direction of the first side 3011 (the right side shown in FIG. 16). For example, an extension line of the portion of the second primary signal line 211 located on the first side of the third sub-pixel G1" in the direction of the vertical line 3013 of the first side 3011 passes through the center of the first sub-pixel R3. Alternatively, the second primary signal line 211 may also be sequentially routed along the interval between the first sub-pixel R3 and the second sub-pixel B3, an interval between the second sub-pixel B3 and the third sub-pixel G1 ", and the second side of the third sub-pixel G1" in the direction of the first side 3011 (the second side shown in FIG. 16). For example, an extension line of the portion of the second primary signal line 211 located on the second side of the third sub-pixel G1" in the direction of the vertical line 3013 of the first side 3011 passes through the center of the second sub-pixel B3.

Optionally, a portion of the second primary signal line 211 located in the first sub-unit 301 and a portion of the second primary signal line 211 located in the second sub-unit 302 is mirror symmetrical with respect to the second side 3012 of the virtual rectangle in the first sub-unit 301.

Figure 19:
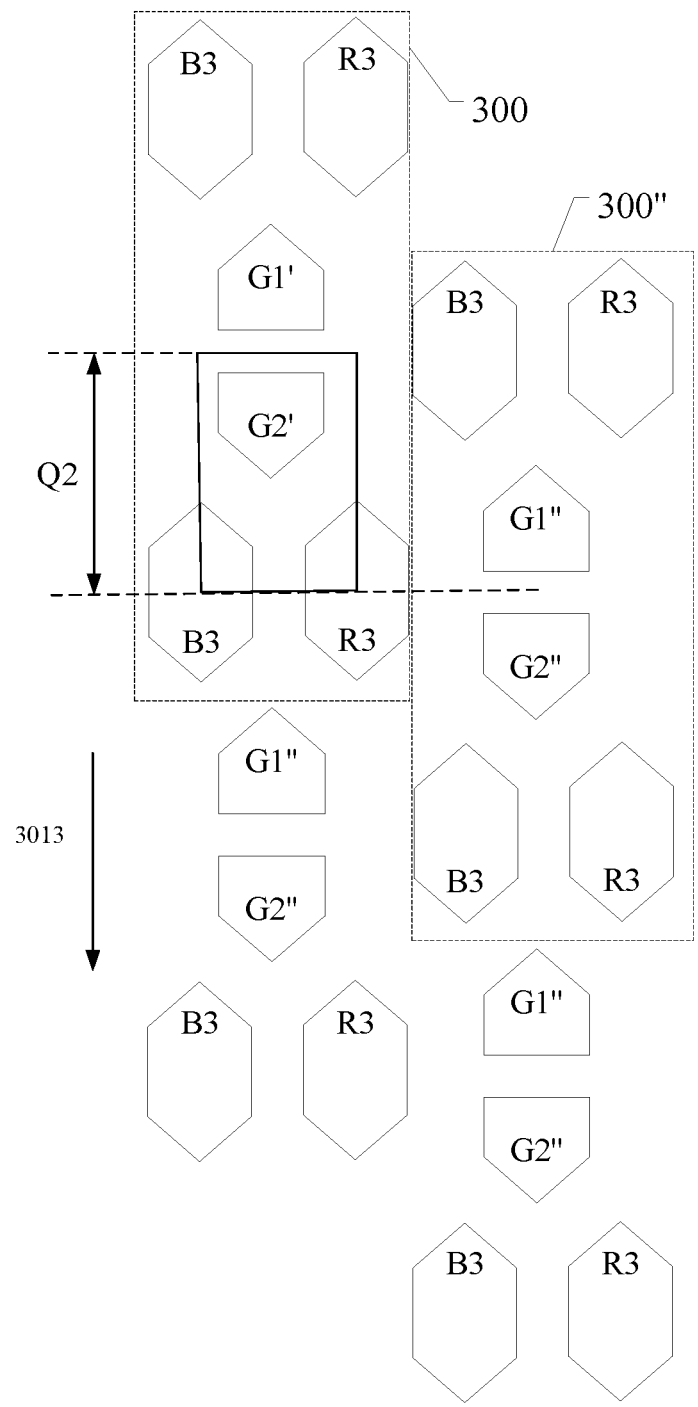
FIG. 19 is a schematic diagram of two pixel group columns in the display substrate shown in FIG. 16.

FIG. 19 is a schematic diagram of two pixel group columns in the display substrate shown in FIG. 16.

Optionally, the distance between the centers of two adjacent pixel groups of adjacent pixel group columns in the direction of the vertical line 3013 of the first side is the length of the virtual rectangle in the first sub-unit in the direction of the vertical line of the first side 3013. As shown in FIG. 19, a pixel group 300 and a pixel group 300" are located in two adjacent pixel group columns, and the distance Q2 between the center of the pixel group 300 and the center of the pixel group 300" is the length of the virtual rectangle in the first sub-unit of the pixel group 300 in the direction of the vertical line 3013 of the first side. That is, if the center of the pixel group 300 is located on an extension line of the line connecting the centers of the first sub-pixel R3 and the second sub-pixel B3 in the first sub-unit of the pixel group 300", the center of the pixel group 300" is located on an extension line of the line connecting the centers of the first sub-pixel R3 and the second sub-pixel B3 in the second sub-unit of the pixel group 300.

Optionally, the display substrate 10 of any of the above may be applied to a liquid crystal display panel, and may also be applied to an organic light-emitting diode display panel.

Optionally, the display substrate 10 may be an array substrate. Taking the display substrate 10 shown in FIG. 1 as an example, in the repeating unit 100, the first sub-pixel R1 includes a first color pixel electrode and a first color luminescent layer disposed on the first color pixel electrode, the second sub-pixel B1 includes a second color pixel electrode and a second color luminescent layer disposed on the second color pixel electrode, and the third sub-pixel G1/G2 includes a third color pixel electrode and a third color luminescent layer disposed on the third color pixel electrode.

Optionally, the shape of the first color pixel electrode is the same as the shape of the first sub-pixel R1 and is configured to drive the first color luminescent layer to emit light; the shape of the second color pixel electrode is the same as the shape of the second sub-pixel B1 and is configured to drive the second color luminescent layer to emit light; and the shape of the third color pixel electrode is the same as the shape of the third sub-pixel G1/G2 and is configured to drive the third color luminescent layer to emit light, which is not limited in the embodiment of the present disclosure. The shape of each color pixel electrode may be different from the shape of each sub-pixel, and the shape of each sub-pixel may be defined by the pixel defining layer.

It should be noted that the shape of each sub-pixel described above is the shape of the light-emitting region of each sub-pixel. In addition, the specific shape of each color luminescent layer may be set according to a preparation process, which is not limited in the embodiment of the present disclosure. For example, the shape of each color luminescent layer may be determined by the shape of the opening of the mask in the preparation process.

Optionally, in some examples, the first color luminescent layer is configured to emit red light, the second color luminescent layer is configured to emit blue light, and the third color luminescent layer is configured to emit green light.

Optionally, when the display substrate 10 is applied to a liquid crystal display panel, the display substrate 10 may also be a color filter substrate. In the repeating unit 100, the first sub-pixel R1 includes a first color filter, the second sub-pixel B1 includes a second color filter, and the third sub-pixel G1 includes a third color filter. It should be noted that when the display substrate 10 is a color filter substrate, it may be used not only for a liquid crystal display panel but also for a display panel using a white light OLED combined with a color film mode.

Optionally, the first color filter may be a red color filter, the second color filter may be a blue color filter, and the third color filter may be a green color filter.

Figure 20:
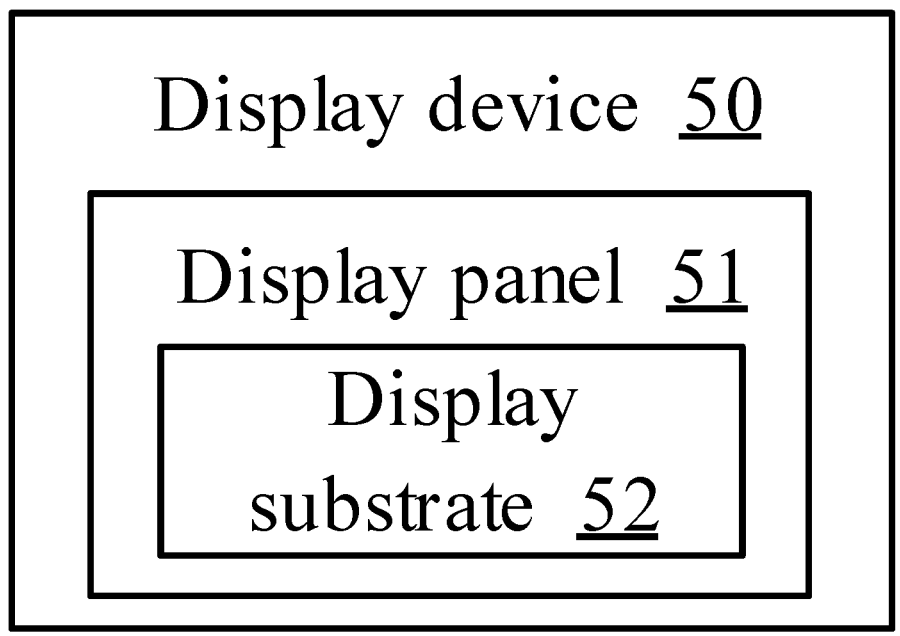
FIG. 20 is a schematic block diagram of a display device according to an embodiment of the present disclosure.

FIG. 20 is a schematic block diagram of a display device according to an embodiment of the present disclosure.

Optionally, as shown in FIG. 20, a display device 50 according to an embodiment of the present disclosure includes a display panel 51 including a display substrate 52 of any of the above.

Optionally, the display panel 51 may be a liquid crystal display panel or an organic light-emitting diode (OLED) display panel or the like. When the display panel 51 is a liquid crystal display panel, the display substrate 52 may be an array substrate or a color filter substrate. When the display panel 51 is an organic light-emitting diode display panel, the display substrate 52 may be an array substrate.

For example, in some examples, display device 50 may be any product or component having a display function, such as a cell phone, a tablet, a television, a display, a notebook, a digital photo frame, a navigator, or the like.

It should be noted that other components of the display device 50 (e.g., a control device, an image data encoding/decoding device, a row scan driver, a column scan driver, a clock circuit, or the like) should be included for a person of ordinary skill in the art, which are not described herein, nor construed as limiting the present disclosure.

For the present disclosure, the following points need to be explained:

(1) The drawings of the present disclosure relate only to the structure related to the embodiment of the present disclosure, and other structures may be referenced to a general design.

(2) In the case of no conflict, the embodiments of the present disclosure and the features in the embodiments may be combined with each other to obtain a new embodiment.

Described above are only the specific embodiment of the present disclosure, but the scope of the present disclosure is not limited thereto. The scope of protection of the present disclosure is subject to the appended claims.

What is claimed is:

1. A display substrate, comprising: a plurality of repeating units, a plurality of primary signal lines and an auxiliary signal line; wherein
    each of the repeating units comprises a first sub-pixel, a second sub-pixel, and two third sub-pixels;
    in each of the repeating units, the first sub-pixel and the second sub-pixel are arranged in a first direction, and the two third sub-pixels are arranged in a second direction, the first direction being different from the second direction; and
    the two third sub-pixels are located between two adjacent primary signal lines, at least one auxiliary signal line is disposed between the two adjacent primary signal lines, two ends of the auxiliary signal line are respectively connected to the two adjacent primary signal lines, and the two third sub-pixels are respectively located on two sides of the auxiliary signal line.

2. The display substrate according to claim 1, wherein extending directions of the plurality of primary signal lines are the same, and an extending direction of the auxiliary signal line is different from the extending direction of the plurality of primary signal lines.

3. The display substrate according to claim 1, wherein extending directions of the plurality of primary signal lines are the second direction, of the primary signal lines have a shape of wave;
    On the same side of the primary signal line, a peak portion of the wave is adjacent to the first sub-pixel, and a trough portion of the wave is adjacent to the second sub-pixel.

4. The display substrate according to claim 1, wherein the auxiliary signal line satisfies the following condition:
    the plurality of repeating units form a plurality of repeating unit rows, each of the repeating unit rows comprising a plurality of repeating units that are arranged in a third direction, the plurality of repeating unit rows being arranged in a fourth direction, the third direction being different from the fourth direction;
    the auxiliary signal line comprises a first line segment, a second line segment, and a third line segment, the third line segment extending in the first direction, the first line segment being located between the first sub-pixel and the second sub-pixel directly adjacent to the first sub-pixel in an adjacent repeating unit row, the third line segment being located between two third sub-pixels in the same repeating unit, and one end of the second line segment being connected to the first line segment, and the other end of the second line segment being connected to the third line segment;
    a projection of the third line segment of the auxiliary signal line located in an odd-numbered repeating unit row in the second direction does not overlap a projection of the third line segment of the auxiliary signal line located in an even-numbered repeating unit row in the second direction; or
    the plurality of repeating units form a plurality of repeating unit columns, each of the repeating unit columns comprising a plurality of repeating units that are arranged in a third direction, and the plurality of repeating unit columns being arranged in a fourth direction, the third direction being different from the fourth direction;
    the auxiliary signal line comprises a first line segment, a second line segment, and a third line segment, the third line segment extending in the first direction, the first line segment being located between the first sub-pixel and the second sub-pixel directly adjacent to the first sub-pixel in an adjacent repeating unit column, the third line segment being located between two third sub-pixels in the same repeating unit, and one end of the second line segment being connected to the first line segment, and the other end of the second line segment being connected to the third line segment;
    a projection of the third line segment of the auxiliary signal line located in an odd-numbered repeating unit column in the second direction does not overlap a projection of the third line segment of the auxiliary signal line located in an even-numbered repeating unit column in the second direction.

5. The display substrate according to claim 1, wherein, in the first direction, in the repeating units, the first sub-pixel and the second sub-pixel are respectively located on two sides of the two third sub-pixels.

6. The display substrate according to claim 1, wherein the two adjacent primary signal lines comprise a first primary signal line and a second primary signal line, and the two adjacent primary signal lines satisfy the following condition:
    the first primary signal line is located on a side of the first sub-pixel distal from the two third sub-pixels, and the second primary signal line is located on a side of the second sub-pixel proximal to the two third sub-pixels; or
    the first primary signal line is located on a side of the first sub-pixel proximal to the two third sub-pixels, and the second primary signal line is located on a side of the second sub-pixel proximal to the two third sub-pixels.

7. The display substrate according to claim 1, wherein with respect to each of the repeating units, two vertices of a first diagonal of a parallelogram are respectively located in the first sub-pixel and the second sub-pixel, and two vertices of a second diagonal of the parallelogram are respectively located in the two third sub-pixels.

8. The display substrate according to claim 7, wherein with respect to each of the repeating units,
    the center of the first sub-pixel and the center of the second sub-pixel respectively coincide with the two vertices of the first diagonal of the parallelogram, and the centers of the two third sub-pixels respectively coincide with the two vertices of the second diagonal of the parallelogram.

9. The display substrate according to claim 7, wherein the plurality of repeating units satisfy the following condition:
    the plurality of repeating units form a plurality of repeating unit rows, each of the repeating unit rows comprising a plurality of repeating units that are arranged in a direction of the first diagonal, the plurality of repeating unit rows being arranged in a direction of the second diagonal; a minimum length of a line connecting centers of mutually-proximate third sub-pixels of two repeating units of adjacent odd-numbered repeating unit rows or adjacent even-numbered repeating unit rows in the same column in the direction of the second diagonal is greater than 1.5 times the length of the first sub-pixel or the second sub-pixel in the direction of the second diagonal; or the plurality of repeating units form a plurality of repeating unit columns, each of the repeating unit columns comprising a plurality of repeating units that are arranged in a direction of the first diagonal, the plurality of repeating unit columns being arranged in a direction of the second diagonal; a minimum length of a line connecting centers of mutually-proximate third sub-pixels of two repeating units of adjacent odd-numbered repeating units or adjacent even-numbered repeating unit columns in the same row is greater than 1.5 times the length of the first sub-pixel or the second sub-pixel in the direction of the second diagonal.

10. The display substrate according to claim 7, wherein in each of the repeating units, a minimum distance between boundaries of the two third sub-pixels is in a direction of the second diagonal is greater than or equal to a minimum distance in a direction of the first diagonal between a boundary of the first sub-pixel in a first repeating unit and a boundary of the second sub-pixel in a second repeating unit, the first repeating unit being adjacent to the second repeating unit in the direction of the first diagonal, and the first sub-pixel in the first repeating unit being adjacent to the second sub-pixel in the second repeating un it.

11. The display substrate according to claim 7, wherein the parallelogram satisfies at least one of the following conditions:
the first diagonal is greater than the second diagonal;
a length of the second diagonal is greater than half of the length of the first sub-pixel in a direction of the second diagonal;
a length of the second diagonal is greater than half of the length of the second sub-pixel in the direction of the second diagonal;
the parallelogram is a diamond; and
a direction of the first diagonal is parallel to the first direction, and a direction of the second diagonal is parallel to the second direction.

12. The display substrate according to claim 7, wherein the plurality of repeating units satisfy the following condition:
the plurality of repeating units form a plurality of repeating unit rows, each of the repeating unit rows comprising a plurality of repeating units that are arranged in a direction of the first diagonal, the plurality of repeating unit rows being arranged in a direction of the second diagonal, and a center of an interval of two adjacent repeating units of an odd-numbered repeating unit row in the direction of the first diagonal is located on an extension line of a line connecting the centers of the two third sub-pixels of an even-numbered repeating unit row; or
the plurality of repeating units form a plurality of repeating unit columns, each of the repeating unit columns comprising a plurality of repeating units that are arranged in a direction of the first diagonal, the plurality of repeating unit columns being arranged in a direction of the second diagonal, and a center of an interval of two adjacent repeating units of an odd-numbered repeating unit column in the direction of the first diagonal is located on an extension line of a line connecting the centers of the two third sub-pixels of an even-numbered repeating unit column.

13. The display substrate according to claim 7, wherein the sub-pixels in the display substrate satisfy at least one of the following conditions:
the length of the first sub-pixel in a direction of the second diagonal is greater than the length of the first sub-pixel in a direction of the first diagonal, and the length of the second sub-pixel in the direction of the second diagonal is greater than the length of the second sub-pixel in the direction of the first diagonal; and
in each of the repeating units, the minimum distance between the boundaries of the two third sub-pixels in the direction of the second diagonal is in the range of 8 to 14 microns.

14. The display substrate according to claim 1, wherein the display substrate satisfies at least one of the following conditions:
the plurality of primary signal lines, the auxiliary signal line, an anode of the first sub-pixel, an anode of the second sub-pixel and an anode of the third sub-pixel are located in the same layer;
the first direction is perpendicular to the second direction; and
the first sub-pixel is a blue sub-pixel, the second sub-pixel is a red sub-pixel, and the third sub-pixel is a green sub-pixel.

15. A display substrate, comprising: a plurality of pixel groups, a plurality of primary signal lines, and an auxiliary signal line; wherein
each of the pixel groups comprises two first sub-pixels, two second sub-pixels, and two third sub-pixels;
in each of the pixel groups, lines connecting centers of the two first sub-pixels and centers of the second sub-pixels form a rectangle, the rectangle comprising a first axis of symmetry and a second axis of symmetry perpendicular to the first axis of symmetry, and the two third sub-pixels are arranged in a direction of the second axis of symmetry and are respectively located on two sides of the first axis of symmetry;
the plurality of pixel groups form a pixel group column in the direction of the second axis of symmetry, and in the direction of the second axis of symmetry, two adjacent pixel groups share a first sub-pixel and a second sub-pixel; and
in each of the pixel groups, the two third sub-pixels are located between two adjacent primary signal lines, at least one auxiliary signal line is disposed between the two adjacent primary signal lines, two ends of the auxiliary signal line are respectively connected to the two adjacent primary signal lines, and the two third sub-pixels are respectively located on two sides of the auxiliary signal line.

16. The display substrate according to claim 15, wherein a distance between centers of two adjacent pixel groups located in adjacent pixel group columns in the direction of the second axis of symmetry is half the length of the rectangle in the direction of the second axis of symmetry.

17. The display substrate according to claim 15, wherein the first sub-pixel, the second sub-pixel and the third sub-pixel satisfy at least one of the following conditions:
the two third sub-pixels are symmetrically disposed about the first axis of symmetry;
centers of the two third sub-pixels are located on the second axis of symmetry; and
shapes of the first sub-pixel and the second sub-pixel are both a hexagon, and shapes of the two third sub-pixels are both a pentagon.

18. The display substrate according to claim 15, wherein the plurality of primary signal lines are configured to supply a reference voltage or a common voltage to the plurality of pixel groups.

19. A display device, comprising a display substrate; wherein the display substrate satisfies the following condition:
- the display substrate comprises: a plurality of repeating units, a plurality of primary signal lines and an auxiliary signal line; wherein each of the repeating units comprises a first sub-pixel, a second sub-pixel, and two third sub-pixels; in each of the repeating units, the first sub-pixel and the second sub-pixel are arranged in a first direction, and the two third sub-pixels are arranged in a second direction, the first direction being different from the second direction; and the two third sub-pixels are located between two adjacent primary signal lines, at least one auxiliary signal line is disposed between the two adjacent primary signal lines, two ends of the auxiliary signal line are respectively connected to the two adjacent primary signal lines, and the two third sub-pixels are respectively located on two sides of the auxiliary signal line; or
- the display substrate comprises: a plurality of pixel groups, a plurality of primary signal lines, and an auxiliary signal line; wherein each of the pixel groups comprises two first sub-pixels, two second sub-pixels, and two third sub-pixels; in each of the pixel groups, lines connecting centers of the two first sub-pixels and centers of the second sub-pixels form a rectangle, the rectangle comprising a first axis of symmetry and a second axis of symmetry perpendicular to the first axis of symmetry, and the two third sub-pixels are arranged in a direction of the second axis of symmetry and are respectively located on two sides of the first axis of symmetry; the plurality of pixel groups form a pixel group column in the direction of the second axis of symmetry, and in the direction of the second axis of symmetry, two adjacent pixel groups share a first sub-pixel and a second sub-pixel; and in each of the pixel groups, the two third sub-pixels are located between two adjacent primary signal lines, at least one auxiliary signal line is disposed between the two adjacent primary signal lines, two ends of the auxiliary signal line are respectively connected to the two adjacent primary signal lines, and the two third sub-pixels are respectively located on two sides of the auxiliary signal line.

20. The display substrate according to claim 7, wherein extending directions of the plurality of primary signal lines are the same, and an extending direction of the auxiliary signal line is different from the extending direction of the plurality of primary signal lines;
- the extending directions of the plurality of primary signal lines are the second direction, the primary signal lines have a shape of wave, and on the same side of the primary signal line, a peak portion of the wave is adjacent to the first sub-pixel, and a trough portion of the wave is adjacent to the second sub-pixel;
- in the first direction, in the repeating units, the first sub-pixel and the second sub-pixel are respectively located on two sides of the two third sub-pixels;
- with respect to each of the repeating units, the center of the first sub-pixel and the center of the second sub-pixel respectively coincide with the two vertices of the first diagonal of the parallelogram, and the centers of the two third sub-pixels respectively coincide with the two vertices of the second diagonal of the parallelogram;
- in each of the repeating units, a minimum distance between boundaries of the two third sub-pixels is in a direction of the second diagonal is greater than or equal to a minimum distance in a direction of the first diagonal between a boundary of the first sub-pixel in a first repeating unit and a boundary of the second sub-pixel in a second repeating unit, the first repeating unit being adjacent to the second repeating unit in the direction of the first diagonal, and the first sub-pixel in the first repeating unit being adjacent to the second sub-pixel in the second repeating unit;
- the first diagonal is greater than the second diagonal;
- a length of the second diagonal is greater than half of the length of the first sub-pixel in a direction of the second diagonal;
- a length of the second diagonal is greater than half of the length of the second sub-pixel in the direction of the second diagonal;
- the parallelogram is a diamond;
- a direction of the first diagonal is parallel to the first direction, and a direction of the second diagonal is parallel to the second direction;
- the length of the first sub-pixel in a direction of the second diagonal is greater than the length of the first sub-pixel in a direction of the first diagonal, and the length of the second sub-pixel in the direction of the second diagonal is greater than the length of the second sub-pixel in the direction of the first diagonal;
- in each of the repeating units, the minimum distance between the boundaries of the two third sub-pixels in the direction of the second diagonal is in the range of 8 to 14 microns;
- the display substrate satisfies at least one of the following conditions:
- the plurality of primary signal lines, the auxiliary signal line, an anode of the first sub-pixel, an anode of the second sub-pixel and an anode of the third sub-pixel are located in the same layer;
- the first direction is perpendicular to the second direction; and
- the first sub-pixel is a blue sub-pixel, the second sub-pixel is a red sub-pixel, and the third sub-pixel is a green sub-pixel; and
- the plurality of repeating units satisfy the following condition:
- the plurality of repeating units form a plurality of repeating unit rows, each of the repeating unit rows comprising a plurality of repeating units that are arranged in the direction of the first diagonal, the plurality of repeating unit rows being arranged in the direction of the second diagonal; the auxiliary signal line comprises a first line segment, a second line segment, and a third line segment, the third line segment extending in the first direction, the first line segment being located between the first sub-pixel and the second sub-pixel directly adjacent to the first sub-pixel in an adjacent repeating unit row, the third line segment being located between two third sub-pixels in the same repeating unit, and one end of the second line segment being connected to the first line segment, and the other end of the second line segment being connected to the third line segment; a projection of the third line segment of the auxiliary signal line located in an odd-numbered repeating unit row in the second direction does not overlap a projection of the third line segment of the auxiliary signal line located in an even-numbered repeating unit row in the second direction; the plurality of repeating units form a plurality of repeating unit rows, each of the repeating unit rows comprising a plurality of repeating units that are arranged in a direction of the first diagonal, the plurality of repeating unit rows being arranged in a direction of the second diagonal; a minimum length of a line connecting centers of mutually-proximate third sub-pixels of two repeating units of adjacent odd-numbered repeating unit rows or adjacent even-numbered repeating unit rows in the same column in the direction of the second diagonal is greater than 1.5 times the length of the first sub-pixel or the second sub-pixel in the direction of the second diagonal; the plurality of repeating units form a plurality of repeating unit rows, each of the repeating unit rows comprising a plurality of repeating units that are arranged in a direction of the first diagonal, the plurality of repeating unit rows being arranged in a direction of the second diagonal, and a center of an interval of two adjacent repeating units of an odd-numbered repeating unit row in the direction of the first diagonal is located on an extension line of a line connecting the centers of the two third sub-pixels of an even-numbered repeating unit row; or the plurality of repeating units form a plurality of repeating unit columns, each of the repeating unit columns comprising a plurality of repeating units that are arranged in the direction of the first diagonal, and the plurality of repeating unit columns being arranged the direction of the second diagonal; the auxiliary signal line comprises a first line segment, a second line segment, and a third line segment, the third line segment extending in the first direction, the first line segment being located between the first sub-pixel and the second sub-pixel directly adjacent to the first sub-pixel in an adjacent repeating unit column, the third line segment being located between two third sub-pixels in the same repeating unit, and one end of the second line segment being connected to the first line segment, and the other end of the second line segment being connected to the third line segment; a projection of the third line segment of the auxiliary signal line located in an odd-numbered repeating unit column in the second direction does not overlap a projection of the third line segment of the auxiliary signal line located in an even-numbered repeating unit column in the second direction; the plurality of repeating units form a plurality of repeating unit columns, each of the repeating unit columns comprising a plurality of repeating units that are arranged in a direction of the first diagonal, the plurality of repeating unit columns being arranged in a direction of the second diagonal; a minimum length of a line connecting centers of mutually-proximate third sub-pixels of two repeating units of adjacent odd-numbered repeating units or adjacent even-numbered repeating unit columns in the same row is greater than 1.5 times the length of the first sub-pixel or the second sub-pixel in the direction of the second diagonal; the plurality of repeating units form a plurality of repeating unit columns, each of the repeating unit columns comprising a plurality of repeating units that are arranged in a direction of the first diagonal, the plurality of repeating unit columns being arranged in a direction of the second diagonal, and a center of an interval of two adjacent repeating units of an odd-numbered repeating unit column in the direction of the first diagonal is located on an extension line of a line connecting the centers of the two third sub-pixels of an even-numbered repeating unit column.

* * * * *